United States Patent
Su et al.

(10) Patent No.: US 11,404,426 B2
(45) Date of Patent: Aug. 2, 2022

(54) CONTROLLING TRAP FORMATION TO IMPROVE MEMORY WINDOW IN ONE-TIME PROGRAM DEVICES

(71) Applicant: Taiwan Semiconductor Manufacturing Co., Ltd., Hsin-Chu (TW)

(72) Inventors: Hsin-Wen Su, Dounan Township (TW); Lien Jung Hung, Taipei (TW); Ping-Wei Wang, Hsin-Chu (TW); Yu-Kuan Lin, Taipei (TW); Shih-Hao Lin, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 290 days.

(21) Appl. No.: 16/781,274

(22) Filed: Feb. 4, 2020

(65) Prior Publication Data

US 2021/0242222 A1    Aug. 5, 2021

(51) Int. Cl.
*H01L 27/112* (2006.01)
*H01L 21/8234* (2006.01)
*H01L 23/525* (2006.01)
*H01L 29/66* (2006.01)
*G11C 17/14* (2006.01)

(52) U.S. Cl.
CPC ...... *H01L 27/11206* (2013.01); *G11C 17/146* (2013.01); *H01L 21/823462* (2013.01); *H01L 23/5252* (2013.01); *H01L 29/66545* (2013.01)

(58) Field of Classification Search
CPC ........... H01L 27/11206; H01L 23/5252; H01L 29/66545
See application file for complete search history.

(56) References Cited

U.S. PATENT DOCUMENTS

| | | | | |
|---|---|---|---|---|
| 8,933,492 B2 * | 1/2015 | Kurjanowicz | ...... | H01L 27/0207 257/209 |
| 2007/0257331 A1 * | 11/2007 | Kurjanowicz | .... | H01L 27/11206 257/E21.666 |
| 2011/0309434 A1 * | 12/2011 | Huang | .................. | H01L 29/518 257/326 |

(Continued)

FOREIGN PATENT DOCUMENTS

KR     20140003088 A  *  1/2014

OTHER PUBLICATIONS

Azizi et al. "Gate Oxide Breakdown" Published on Dec. 2, 2003. Retrieved online on Sep. 26, 2019 from https://pdfs.semanticscholar.org/9cf9/abd42560ad0c69fb1df3d33951ee8860fae4.pdf?_ga=2.49476390.1693117549.1580759755-21291928.1580759755.

(Continued)

*Primary Examiner* — Aaron J Gray
(74) *Attorney, Agent, or Firm* — Eschweiler & Potashnik, LLC

(57) ABSTRACT

In some embodiments, the present disclosure relates to a one-time program (OTP) memory cell. The OTP memory cell includes a read transistor and a program transistor neighboring the read transistor. The read transistor includes a read dielectric layer and a read gate electrode overlying the read dielectric layer. The program transistor includes a program dielectric layer and a program gate electrode overlying the program dielectric layer. The program transistor has a smaller breakdown voltage than the read transistor.

20 Claims, 18 Drawing Sheets

(56) References Cited

U.S. PATENT DOCUMENTS

| | | | | |
|---|---|---|---|---|
| 2013/0126979 A1* | 5/2013 | Chern | ............... | H01L 27/11206 |
| | | | | 257/E27.113 |
| 2015/0129975 A1* | 5/2015 | Zheng | ............... | H01L 27/11206 |
| | | | | 438/238 |
| 2017/0162503 A1* | 6/2017 | Olac-Vaw | ......... | H01L 29/42376 |
| 2019/0068383 A1 | 2/2019 | Wang | | |
| 2020/0051987 A1* | 2/2020 | Wang | ............... | H01L 21/76224 |

OTHER PUBLICATIONS

The Free Dictionary. "Antifuse" The date of publication is unknown. Retrieved online on Sep. 26, 2019 from https://encyclopedia2.thefreedictionary.com/antifuse.

Semiconductor Engineering. "One-Time-Programmable Memory (OTP)" The date of publication is unknown. Retrieved online on Sep. 26, 2019 from https://semiengineering.com/knowledge_centers/memory/one-time-programmable-memory/.

Wikipedia.org. "High-K Dielectric" Published on Oct. 17, 2019.

Wikipedia.org "Low-K Dielectric" Published on Oct. 17, 2019.

Wikipedia.org "Programmable Read-Only Memory" Published on Sep. 24, 2019.

* cited by examiner

CONTROLLING TRAP FORMATION TO IMPROVE MEMORY WINDOW IN ONE-TIME PROGRAM DEVICES

BACKGROUND

Many modern day electronic devices include electronic memory. Electronic memory is a device configured to store bits of data in respective memory cells. A memory cell is a circuit configured to store a bit of data, typically using one or more transistors. One type of electronic memory is one-time program (OTP) memory. OTP memory is read-only memory that may only be programmed (e.g., written to) once.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6, 7, 8A and 8B through 18A and 18B, and 19 illustrate various views of some embodiments of a method of forming an integrated chip having an OTP memory cell comprising a program dielectric layer that is more damaged than a read dielectric layer.

DETAILED DESCRIPTION

Figure 1A:
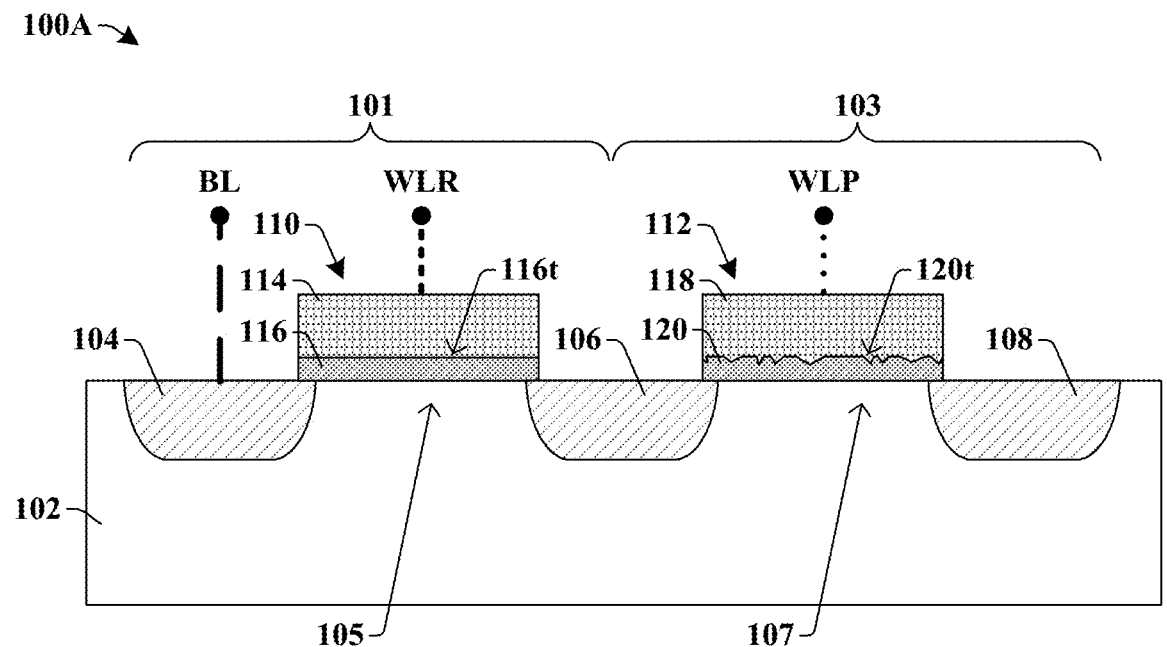
FIG. 1A illustrates a cross-sectional view of some embodiments of an integrated chip having a one-time program (OTP) memory cell comprising a program dielectric layer that is more damaged than a read dielectric layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A one-time program (OTP) memory cell includes a program transistor coupled in series with a read transistor. The read transistor comprises a read gate electrode arranged over a read dielectric layer, and the program transistor comprises a program gate electrode arranged over a program dielectric layer. In an OTP memory cell that has not been programmed, when read voltage conditions are applied to the program and read transistors, a first current corresponding to a first data state (e.g., logical '0') is read from the OTP memory cell.

An OTP memory cell may be programmed by applying write voltage conditions across the program dielectric layer that exceed a breakdown voltage of the program transistor to break down the program dielectric layer, such that conductive paths are formed within the program dielectric layer. Thus, after the OTP memory cell has been programmed, a voltage applied to the program gate electrode may travel through the program dielectric layer. Further, when the read voltage conditions are applied to the program and read transistors, a second current that is different than the first current and corresponds to a second data state (e.g., logical '1') is read from the OTP memory cell. The formation of conductive paths is not able to be reversed by a different write operation, and thus, the OTP memory cell can only be programmed (e.g., written to) one time.

The second current is larger in magnitude than the first current. The difference between the first current and the second current may be referred to as the memory window of the OTP memory cell. The larger the memory window, the easier it is to distinguish between the first current and the second current, and thus, the more reliable the OTP memory cell is in reading and writing data states.

Various embodiments in the present disclosure relate to increasing the second current that corresponds to the second data state (e.g., logical '1') in order to increase the memory window of the cell. Increasing an amount or concentration of traps (e.g., defects) decreases the breakdown voltage of the program transistor of the OTP memory cell and increases the second current. The second current may be increased by decreasing the breakdown voltage of the program transistor of the OTP memory cell. In some embodiments, increasing the number of traps (e.g., defects) in the program dielectric layer decreases the breakdown voltage of the program transistor because the traps decrease the energy gap for the formation of conductive paths in the program dielectric layer. Further, increasing the number of traps (e.g., defects) in the program dielectric layer also increases the second current because conductive paths may be more easily formed due to the lower breakdown voltage. Thus, under the same write and read voltage conditions, when the program dielectric layer has more traps, the breakdown voltage is lower, the number of conductive paths formed increases, and thus, the second current increases. An OTP memory device may be formed such that the program dielectric layer has a higher number of traps than the read dielectric layer, and therefore, the program transistor may have a lower breakdown voltage than the read transistor.

Increasing the number of traps in the program dielectric layer may be conducted by increasing the etching time, increasing the number of times the program dielectric layer is exposed to etching processes, and/or increasing the types of etchants that the program dielectric layer is exposed to during manufacturing, while the read dielectric layer remains substantially protected. For example, in some embodiments, dummy gates may be removed from the OTP memory cell using a first etchant, and the program dielectric layer may be exposed to the first etchant longer than the read dielectric layer. So, the program dielectric layer may be more damaged (e.g., have a higher concentration of traps) than the read dielectric layer. By protecting the read dielectric layer during the etching process(es), leakage when the OTP memory cell is "OFF" is mitigated. For example, if the read dielectric layer were exposed to the same processing steps as the program dielectric layer, the program dielectric layer and the read dielectric layer would both have an increased number of traps, a decreased breakdown voltage, and thus, a higher chance of leakage of current when the OTP memory cell is "OFF." Thus, by increasing the number of traps and decreasing the breakdown voltage of the program dielectric layer while protecting the read dielectric layer, the OTP memory cell is more reliable and consumes less power.

FIG. 1A illustrates a cross-sectional view 100A of some embodiments of an integrated chip comprising an OTP memory cell.

The OTP memory cell includes a read transistor 101 coupled to a program transistor 103 on a substrate 102. The read transistor 101 comprises a read gate stack 110 arranged over a read channel region 105 of the substrate 102 and between a first source/drain region 104 and a second source/drain region 106. The read channel region 105 separates the first source/drain region 104 from the second source/drain region 106. In some embodiments, the substrate 102 has a first doping type and the first and second source/drain regions 104, 106 have a second doping type different than the first doping type. For example, in some embodiments, the read transistor 101 is an n-type metal oxide semiconductor field-effect transistor (N-MOSFET), wherein the substrate 102 is p-type and the first and second source/drain regions 104, 106 are n-type. The read gate stack 110 of the read transistor 101 may comprise a read gate electrode 114 arranged over a read dielectric layer 116. In some embodiments, the read dielectric layer 116 directly contacts the read gate electrode 114 and directly contacts the substrate 102. In some embodiments, the first source/drain region 104 is coupled to a bit-line BL, and the read gate electrode 114 is coupled to a read word-line WLR.

The program transistor 103 comprises a program gate stack 112 arranged over a program channel region 107 of the substrate 102 and between the second source/drain region 106 and a third source/drain region 108. The program channel region 107 separates the second source/drain region 106 from the third source/drain region 108. Thus, the program transistor 103 and the read transistor 101 are coupled in series via the second source/drain region 106. In some embodiments, program transistor 103 is also an N-MOSFET, wherein the substrate 102 is p-type and the second and third source/drain regions 106, 108 are n-type. The program gate stack 112 of the program transistor 103 may comprise a program gate electrode 118 arranged over a program dielectric layer 120. In some embodiments, the program dielectric layer 120 directly contacts the program gate electrode 118 and directly contacts the substrate 102. In some embodiments, the program gate electrode 118 is coupled to a program word-line WLP.

In some embodiments, the program gate electrode 118 and the read gate electrode 114 comprise a same conductive material, and in some embodiments, the read dielectric layer 116 and the program dielectric layer 120 comprise a same material and/or have a same thickness. In some embodiments, the material of the read dielectric layer 116 and the program dielectric layer 120 may comprise a high-k dielectric layer, such as, for example, hafnium oxide, zirconium oxide, hafnium silicate, or the like. Although the program gate electrode 118 and the read gate electrode 114 may comprise a same material and the program dielectric layer 120 and the read dielectric layer 116 may comprise a same material and/or have a same thickness, in some embodiments, the program transistor 103 has a smaller breakdown voltage than the read transistor 101. Thus, the program dielectric layer 120 may be more easily broken down, or in other words, may require a smaller voltage bias to be made conductive, than the read dielectric layer 116. The breakdown voltages of the program transistor 103 and the read transistor 101 may be measured through electrical testing.

In some embodiments, the program dielectric layer 120 may have a smaller breakdown voltage than the read dielectric layer 116 because the program dielectric layer 120 has more traps (e.g., defects) than the read dielectric layer 116. In some embodiments, such traps (e.g., defects) may be structurally quantified through average surface roughness measurements. In some embodiments, to measure average surface roughness, a roughness measurement tool (e.g., a profilometer, atomic force microscopy (AFM), etc.) calculates a mean line along a surface and measures the deviation between the height of a peak or valley on the surface from the mean line. After measuring many deviations at many peaks and valleys throughout the surface, the average surface roughness is calculated by taking the mean of the many deviations, where the deviations are absolute values. In other embodiments, the surface roughness is quantified by measuring a total thickness variation (TTV). The TTV of a layer is the difference between the smallest thickness and the largest thickness of the layer. The TTV is measured throughout the length of a layer.

As illustrated in the cross-sectional view 100A of FIG. 1A, in some embodiments, the program dielectric layer 120 has a top surface 120t that has a higher average surface roughness than a top surface 116t of the read dielectric layer 116, which may indicate that the program dielectric layer 120 has a smaller breakdown voltage than the read dielectric layer 116. The top surface 120t of the program dielectric layer 120 may be arranged directly between the program gate electrode 118 and the substrate 102, and the top surface 116t of the read dielectric layer 116 may be arranged directly between the read gate electrode 114 and the substrate 102. With a smaller breakdown voltage, less power may be used to breakdown the program dielectric layer 120 of the program transistor 103 to write a second data value (e.g., a logical '1') onto the OTP memory cell during a write operation, and/or a larger second current corresponding to the second data value (e.g., a logical '1') may read from the bit-line BL during a read operation after the program dielectric layer 120 has been broken down, thereby increasing the memory window and the reliability of the OTP memory cell.

Figure 1B:
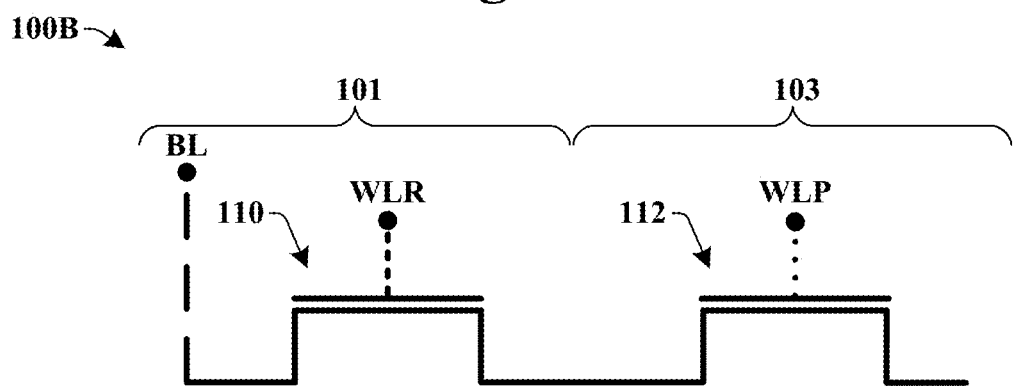
FIGS. 1B and 1C illustrate circuit diagrams of some embodiments of an OTP memory cell corresponding to the cross-sectional view of FIG. 1A.

FIG. 1B illustrates a circuit diagram 100B of some embodiments corresponding to the cross-sectional view 100A of FIG. 1A.

During a read operation before the OTP memory cell has been programmed (e.g., written to), a first voltage may be applied to the program word-line WLP and a second voltage may be applied to the read word-line WLR. The first voltage may be less than the second voltage, and the first voltage may not be large enough for a voltage bias across the program dielectric layer (120 of FIG. 1A) to exceed the threshold voltage and/or breakdown voltage of the program dielectric layer (120 of FIG. 1A). Thus, little to no current may flow through the program gate stack 112. Further, the second voltage applied to the read word-line WLR may not be large enough for a voltage bias across the read dielectric layer (116 of FIG. 1A) to exceed a breakdown voltage of the read dielectric layer (116 of FIG. 16); however, the second voltage applied to the read word-line WLR may exceed a threshold voltage of the read transistor 101 to turn the read transistor 101 "ON." In some embodiments, a first current may be read at the bit-line BL, wherein the bit-line BL is grounded. The first current may be substantially small; for example, in some embodiments, the first current read at the bit-line BL may be between approximately 0 amps and approximately 10 microamps. The first current may correspond to the first data value (e.g., logical '0') indicating the program dielectric layer (120 of FIG. 1A) has not been broken down, and thus, the OTP cell has not been programmed (e.g., written to).

In some embodiments, the first voltage applied to the program word-line WLP during a read operation may be in a range of between, for example, approximately 1 volt and approximately 1.2 volts; the second voltage applied to the read word-line WLR during the read operation may be in a range of between, for example, approximately 0.65 volts and approximately 0.85 volts; and the bit-line BL may be grounded. In other embodiments, the first voltage applied to the program word-line WLP during a read operation, may be in a range of between, for example, approximately 4.7 volts and approximately 4.9 volts; the second voltage applied to the read word-line WLR during the read operation may be in a range of between, for example, approximately 1 volt and approximately 1.2 volts; and a third voltage may be applied to the bit-line BL in a range of between, for example, approximately 1 volt and approximately 1.2 volts.

Figure 1C:
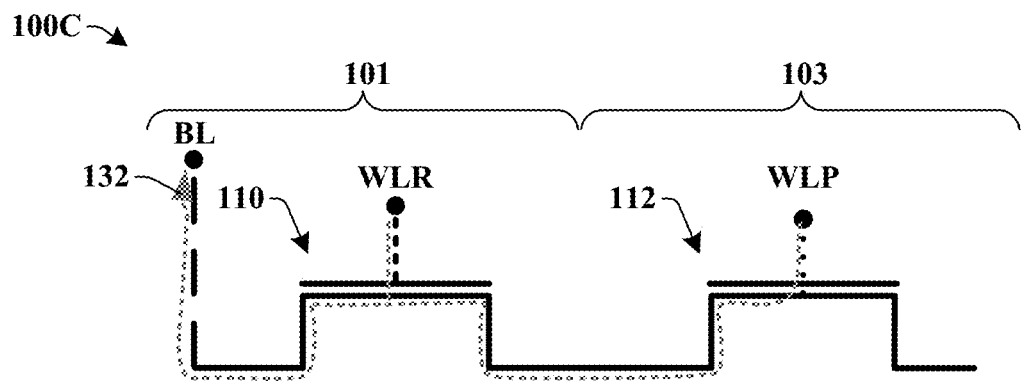

FIG. 1C illustrates a circuit diagram 100C of some embodiments corresponding to the cross-sectional view 100A of FIG. 1A and the circuit diagram 100B of FIG. 1B during a read operation after the OTP memory cell has been programmed.

During a write operation to program (e.g., write to) the OTP memory cell, a fourth voltage greater than the first voltage may be applied to the program word-line WLP and the second voltage may be applied to the read word-line WLR. The fourth voltage may be greater than the second voltage, and the fourth voltage causes the voltage bias across the program dielectric layer (120 of FIG. 1A) to exceed the breakdown voltage of the program dielectric layer (120 of FIG. 1A). Thus, conductive paths are formed in the program dielectric layer (120 of FIG. 1A) and current may flow through the program gate stack 112. In some embodiments, the fourth voltage applied to the program word-line WLP during the read operation may be in a range of between, for example, approximately, 4.7 volts and approximately 4.9 volts; the second voltage applied to the read word-line WLR during the read operation may be in a range of between, for example, approximately 1 volt and approximately 1.2 volts; and the bit-line BL may be grounded.

Then, during a read operation after the OTP memory cell has been programmed (e.g., written to), the first and second voltages may be applied to the program word-line WLP and the read word-line WLR, respectively, and the bit-line BL may be grounded. Although the first voltage may not cause a voltage bias across the program dielectric layer (120 of FIG. 1A) to exceed the breakdown voltage of the program dielectric layer (120 of FIG. 1A), a second current 132 may flow through the program gate stack 112 and be read from the bit-line BL because of the conductive paths formed in the program dielectric layer (120 of FIG. 1A) during the write operation. The second current 132 may correspond to a second data value (e.g., a logical '1') indicating that the OTP memory cell has been programmed (e.g., written to). The second current 132, in some embodiments, may be in a range of between, for example, approximately 100 microamps and approximately 150 microamps.

Because the program dielectric layer (120 of FIG. 1A) has an increased number of traps (e.g., defects), the breakdown voltage of the program transistor 103 is less than the breakdown voltage of the read transistor 101. In some embodiments, the breakdown voltage of the program dielectric layer (120 of FIG. 1A) may be equal to approximately 0.9 volts, and, in some embodiments, the difference between the breakdown voltage of the program transistor 103 and the breakdown voltage of the read transistor 101 may be in a range of between approximately 0.1 volts and approximately 0.3 volts. Further, because the breakdown voltage of the program transistor 103 is smaller, more conductive paths may be formed in the program gate dielectric layer (e.g., 120 of FIG. 1A) under the write voltage conditions and thus, the second current 132 may be larger during the read operation after the OTP memory cell has been programmed (e.g., written to) under the same read voltage conditions. For example, in some embodiments, because the program dielectric layer (120 of FIG. 1A) has more traps, the second current 132 is approximately 1.5 to 2 times larger compared to embodiments wherein the program dielectric layer (120 of FIG. 1A) and the read dielectric layer (116 of FIG. 1A) have about an equal number of traps when the same read voltage conditions are applied.

Figure 2:
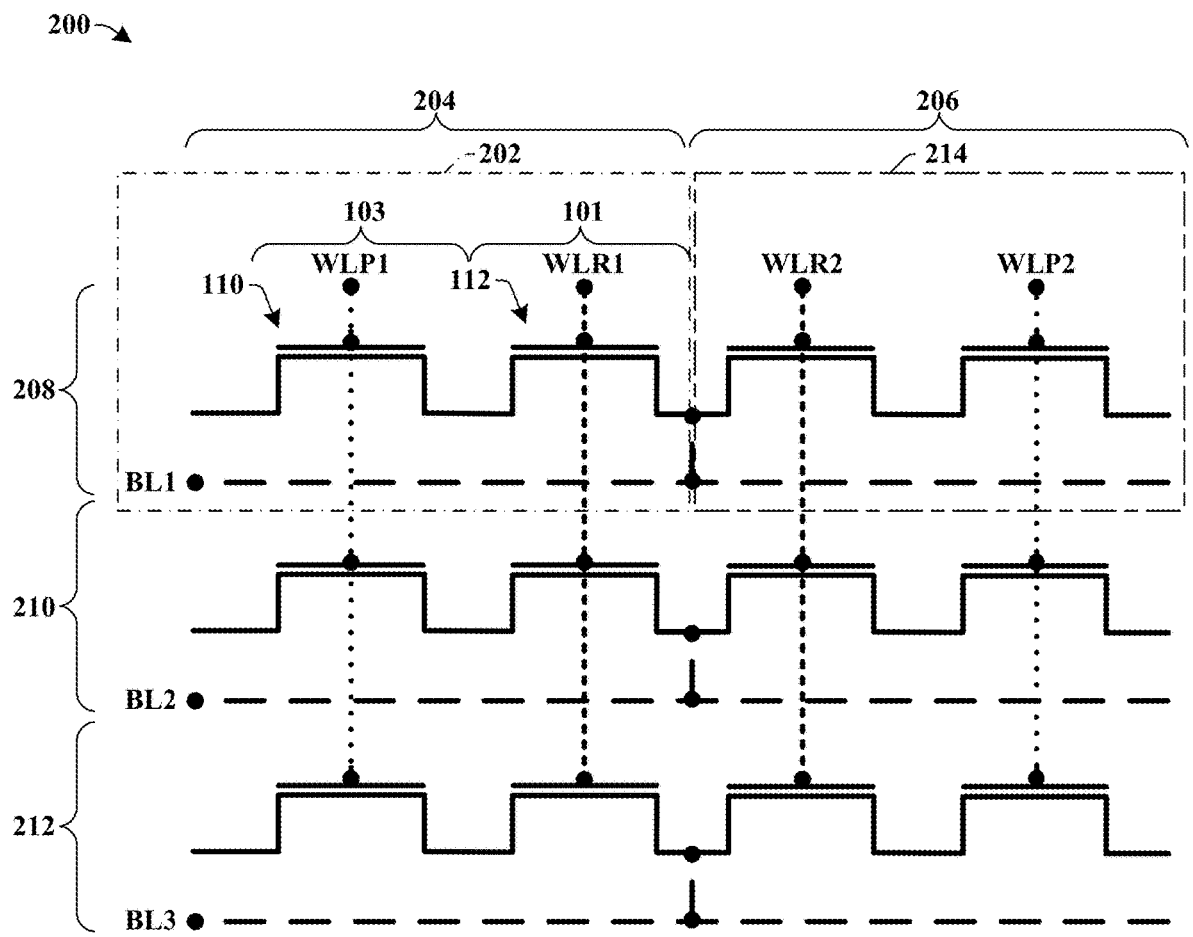
FIG. 2 illustrates a circuit diagram of some embodiments of an OTP memory array comprising multiple OTP memory cells corresponding to the cross-sectional view of FIG. 1A.

FIG. 2 illustrates a circuit diagram 200 of some embodiments of an OTP memory array comprising multiple OTP memory cells corresponding to the cross-sectional view 100A of FIG. 1A.

In some embodiments, a first OTP memory cell 202, as illustrated in the circuit diagram 100B of FIG. 1B, for example, may be a part of an OTP memory array, comprising multiple OTP memory cells. For example, in FIG. 2, the OTP memory array comprises 6 memory cells arranged amongst a first column 204, a second column 206, a first row 208, second row 210, and a third row 212. In some embodiments, to selectively access the first OTP memory cell 202, voltages may be applied to a first bit-line BL1, a first program word-line WLP1, and a first read word-line WLR1, while voltages are not applied to a second bit-line BL2, a third bit-line BL3, a second program word-line WLP2, and a second read word-line WLR2. A second OTP memory cell 214 may also be coupled to the first bit-line BL1. In some embodiments, to access the second OTP memory cell 214 instead of the first OTP memory cell 202, the second program word-line WLP2 and the second read word-line WLR2 are selected instead of the first program word-line WLP1 and the first read word-line WLR1.

Figure 3:
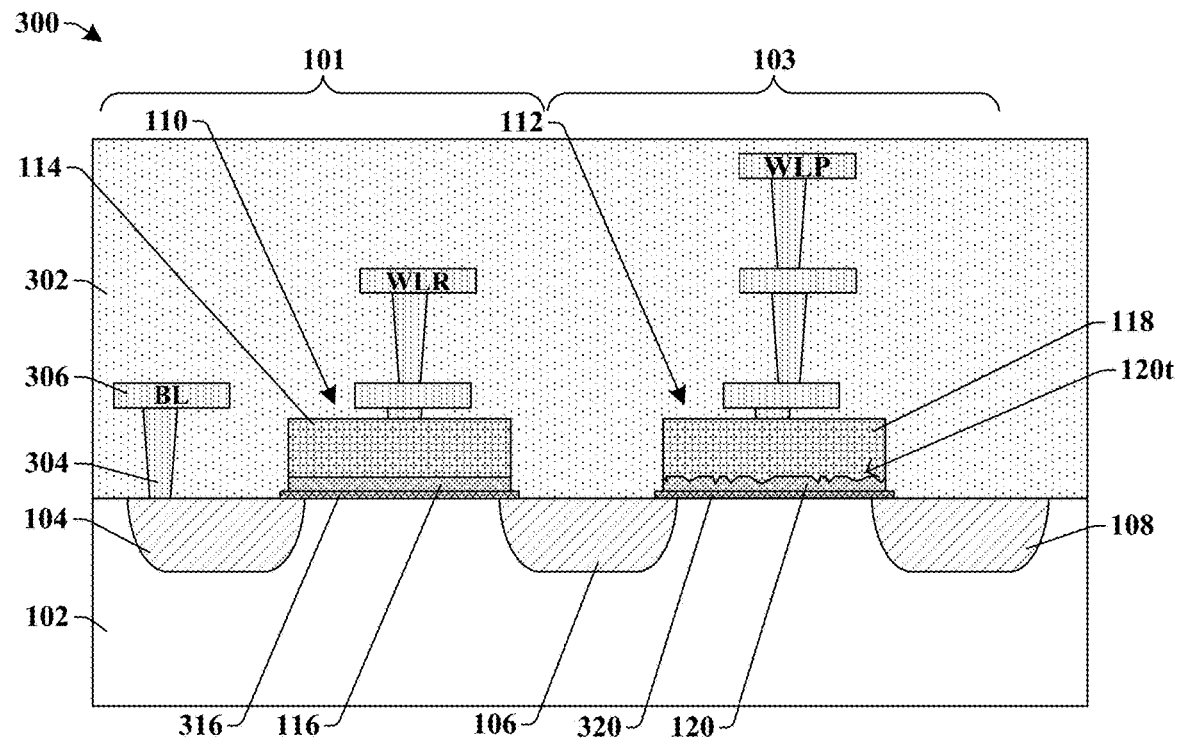
FIG. 3 illustrates a cross-sectional view of some additional embodiments of an OTP memory cell comprising a program dielectric layer that is more damaged than a read dielectric layer.

FIG. 3 illustrates a cross-sectional view 300 of some additional embodiments of an integrated chip comprising an OTP memory cell.

In some embodiments, a read interfacial layer 316 is arranged between the read dielectric layer 116 and the substrate 102, and a program interfacial layer 320 is arranged between the program dielectric layer 120 and the substrate 102. In some embodiments, the read dielectric layer 116 and the program dielectric layer 120 are thicker than the read interfacial layer 316 and the program interfacial layer 320, respectively. In other embodiments, the read dielectric layer 116 and the program dielectric layer 120 are thinner than or about equal in thickness to the read interfacial layer 316 and the program interfacial layer 320, respectively. The read interfacial layer 316 and the program interfacial layer 320 may comprise a material(s) that is used to aid in the formation of the read dielectric layer 116 and the program dielectric layer 120, respectively. For example, in some embodiments, the read dielectric layer 116 and the program dielectric layer 120 may be formed more efficiently on the read interfacial layer 316 and the program interfacial layer 320 than directly on the substrate 102. In some embodiments, the read interfacial layer 316 and the program interfacial layer 320 may comprise, for example, silicon dioxide. Thus, in some embodiments, the read dielectric layer 116 and the program dielectric layer 120 have higher dielectric constants than the read interfacial layer 316 and the program interfacial layer 320, respectively.

In some embodiments, an interconnect structure may be arranged over the read and program transistors 101, 103. For example, in some embodiments, an interconnect dielectric structure 302 is arranged over the read and program gate stacks 110, 112, and interconnect vias 304 and interconnect wires 306 are embedded in the interconnect dielectric structure 302. For example, in some embodiments, the interconnect vias 304 couple the bit-line BL, the read word-line WRL, and the program word-line WLP to the first source/drain region 104, the read gate electrode 114, and the program gate electrode 118, respectively.

Figure 4:
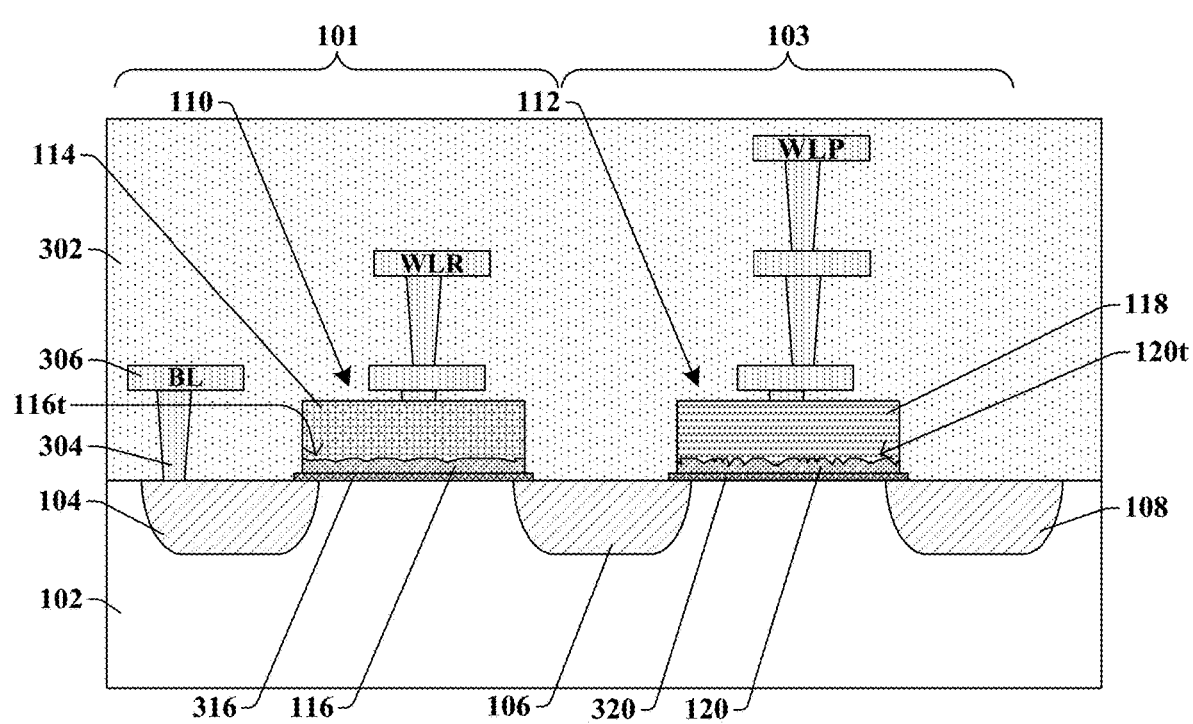
FIG. 4 illustrates a cross-sectional view of some additional embodiments of an OTP memory cell comprising a program dielectric layer that is more damaged than a read dielectric layer and a program gate electrode comprises a different material than a read gate electrode.

FIG. 4 illustrates a cross-sectional view 400 of some additional embodiments of an integrated chip comprising an OTP memory cell.

In some embodiments, the program gate electrode 118 may comprise a different material than the read gate electrode 114. Further, in some embodiments, the program gate electrode 118 and the read gate electrode 114 may each comprise a conductive metal, such as, for example, titanium, titanium nitride, aluminum, or the like. Thus, in some embodiments, the program transistor 103 has a different work function than the read transistor 101. In other embodiments, the program gate electrode 118 and/or the read gate electrode 114 may comprise multiple layers, and in some embodiments, the number of layers and/or materials of the layers may be different between the program gate electrode 118 and the read gate electrode 114. In such embodiments, during manufacturing, the program dielectric layer 120 and/or the read dielectric layer 116 may be exposed to many removal processes (e.g., etching) which induces traps in the program dielectric layer 120 and/or the read dielectric layer 116.

In some embodiments, due to the removal processes, the top surface 116t of the read dielectric layer 116 may have a first average surface roughness, and the top surface 120t of the program dielectric layer 120 may have a second average surface roughness. In some embodiments, the manufacturing of the read gate stack 110 and the program gate stack 112 may be controlled such that more traps are induced in the program dielectric layer 120 that in the read dielectric layer 116. In some embodiments, the traps are induced through longer and/or more etching processes, resulting in the second average surface roughness of the program dielectric layer 120 being greater than the first average surface roughness of the read dielectric layer 116.

Figure 5:
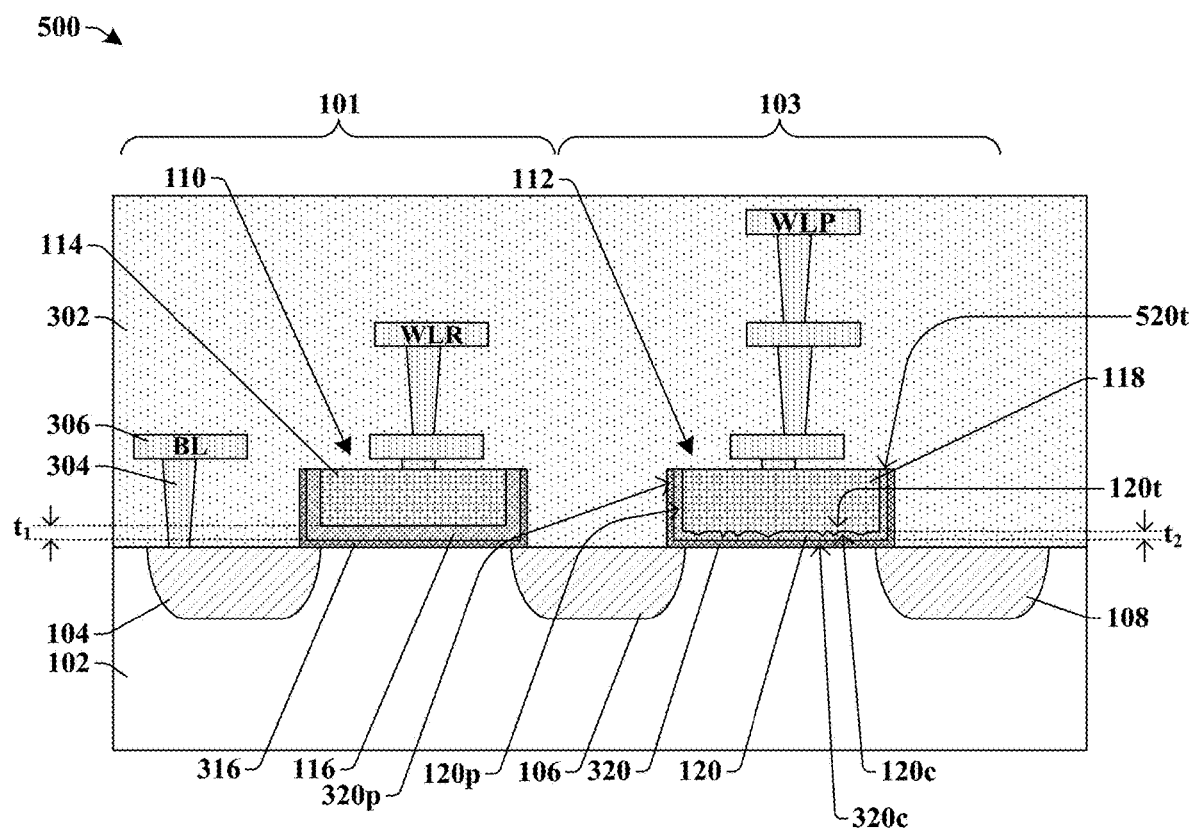
FIG. 5 illustrates a cross-sectional view of some additional embodiments of an OTP memory cell comprising a program dielectric layer that has a smaller thickness than a read dielectric layer.

FIG. 5 illustrates a cross-sectional view 500 of some additional embodiments of an OTP memory cell.

In some embodiments, the read interfacial layer 316, the read dielectric layer 116, the program interfacial layer 320, and/or the program dielectric layer 120 exhibit a substantially "U-shape" from the cross-sectional view 500 surrounding their respective read gate electrode 114 or program gate electrode 118. For example, in some embodiments, the program interfacial layer 320 may comprise a central portion 320c arranged directly between the program gate electrode 118 and the substrate 102, and the program dielectric layer 120 may comprise a central portion 120c that is arranged directly between the central portion 320c of the program interfacial layer 320 and the program gate electrode 118. Peripheral portions 120p of the program dielectric layer 120 may extend from the central portion 120c of the program dielectric layer 120 and surround outer sidewalls of the program gate electrode 118. Peripheral portions 320p of the program interfacial layer 320 may be arranged directly between the interconnect dielectric structure 302 and the peripheral portions 120p of the program dielectric layer 120, in some embodiments. In some embodiments, a top surface 520t of the peripheral portions 120p of the program dielectric layer 120 may have an average surface roughness about equal to the top surface 120t of the central portion 120c of the program dielectric layer 120. In other embodiments, the top surface 520t of the peripheral portions 120p of the program dielectric layer 120 may have an average surface roughness different than the top surface 120t of the central portion 120c of the program dielectric layer 120.

The read dielectric layer 116 has a first average thickness $t_1$ and a first average surface roughness. In some embodiments, the program dielectric layer 120 has a second average thickness $t_2$ that is less than the first average thickness $t_1$ and has a second average surface roughness that is greater than the first average surface roughness. The second average thickness $t_2$ may be less than the first average thickness $t_1$ because the program dielectric layer 120 may be exposed to more removal processes (e.g., etching) than the read dielectric layer 116 and/or may be exposed to one or more removal processes (e.g., etching) for a longer period of time than the read dielectric layer 116. The first average thickness $t_1$ may be measured from portions of the read dielectric layer 116 that are arranged directly between the read gate electrode 114 and the substrate 102. The second average thickness $t_2$ may be measured from portions of the program dielectric layer 120 that are arranged directly between the program gate electrode 118 and the substrate 102, which may correspond to the central portion 120c of the program dielectric layer 120, in some embodiments.

As a result, the program dielectric layer 120 may comprise more traps (e.g., defects) than the read dielectric layer 116, which may be measured, in some embodiments, by the program dielectric layer 120 having a smaller average thickness and/or greater average surface roughness than the read dielectric layer 116. In such embodiments where the program dielectric layer 120 has a greater number of traps than the read dielectric layer 116, the breakdown voltage of the program dielectric layer 120 is less than the read dielectric layer 116.

FIGS. 6, 7, 8A and 8B through 18A and 18B, and 19 illustrate various views 600, 700, 800A and 800B through 1800A and 1800B, and 1900 of some embodiments of a method of controlling the number of traps to reduce the breakdown voltage of a program dielectric layer in a one-time program (OTP) memory cell. Although FIGS. 6, 7, 8A and 8B through 18A and 18B, and 19 are described in relation to a method, it will be appreciated that the structures disclosed in FIGS. 6, 7, 8A and 8B through 18A and 18B, and 19 are not limited to such a method, but instead may stand alone as structures independent of the method.

Figure 6:
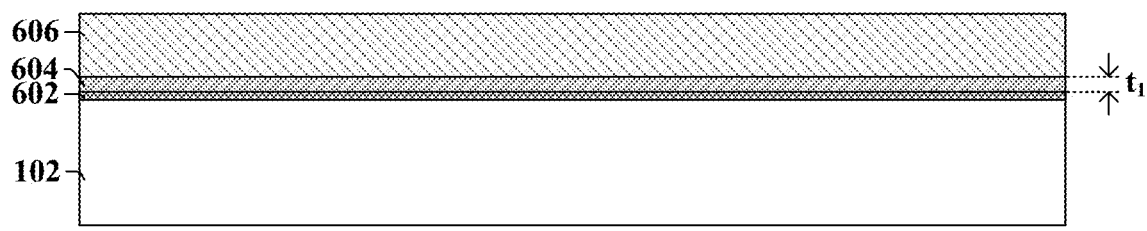

As shown in cross-sectional view 600 of FIG. 6, a continuous interfacial layer 602, a continuous dielectric layer 604, and a dummy gate layer 606 are formed over a substrate 102. The continuous dielectric layer 604 directly contacts the dummy gate layer 606 and is arranged between the dummy gate layer 606 and the continuous interfacial layer 602. In some embodiments, the continuous interfacial layer 602 comprises a dielectric material that has a lower dielectric constant than the continuous dielectric layer 604. For example, in some embodiments, the continuous interfacial layer 602 comprises silicon dioxide, and the continuous dielectric layer 604 comprises hafnium oxide, zirconium oxide, hafnium silicate, some other high-k dielectric, or the like. In some embodiments, the continuous dielectric layer 604 has a first average thickness $t_1$ in a range of between, for example, approximately 2 nanometers and approximately 4 nanometers. The dummy gate layer 606, in some embodiments, comprises polysilicon, for example. The substrate 102, in some embodiments, may comprise any type of semiconductor body (e.g., silicon, germanium, silicon on insulator (SOI) substrate, etc.). In some embodiments, the continuous interfacial layer 602, the continuous dielectric layer 604, and the dummy gate layer 606 may be formed by way of thermal oxidation and/or deposition processes (e.g., chemical vapor deposition (CVD), physical vapor deposition (PVD), atomic layer deposition (ALD), etc.).

Figure 7:
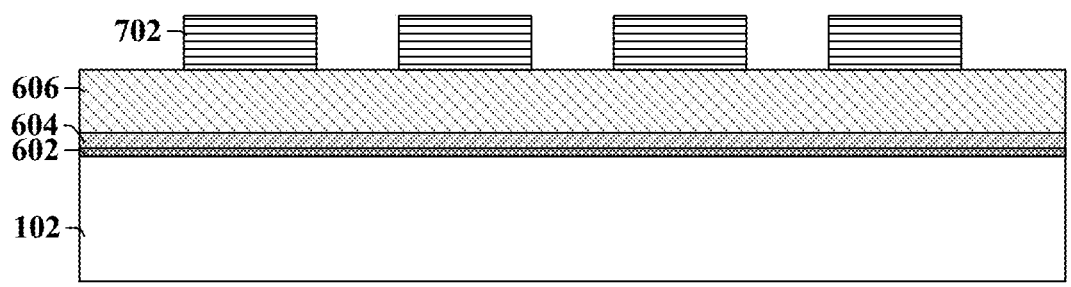

As shown in cross-sectional view 700 of FIG. 7, a first masking structure 702 may be formed over the dummy gate layer 606. The first masking structure 702 may be formed using photolithography and removal (e.g., etching) processes. In some embodiments, the first masking structure 702 comprises a photoresist material or a hard mask material.

Figure 8A:
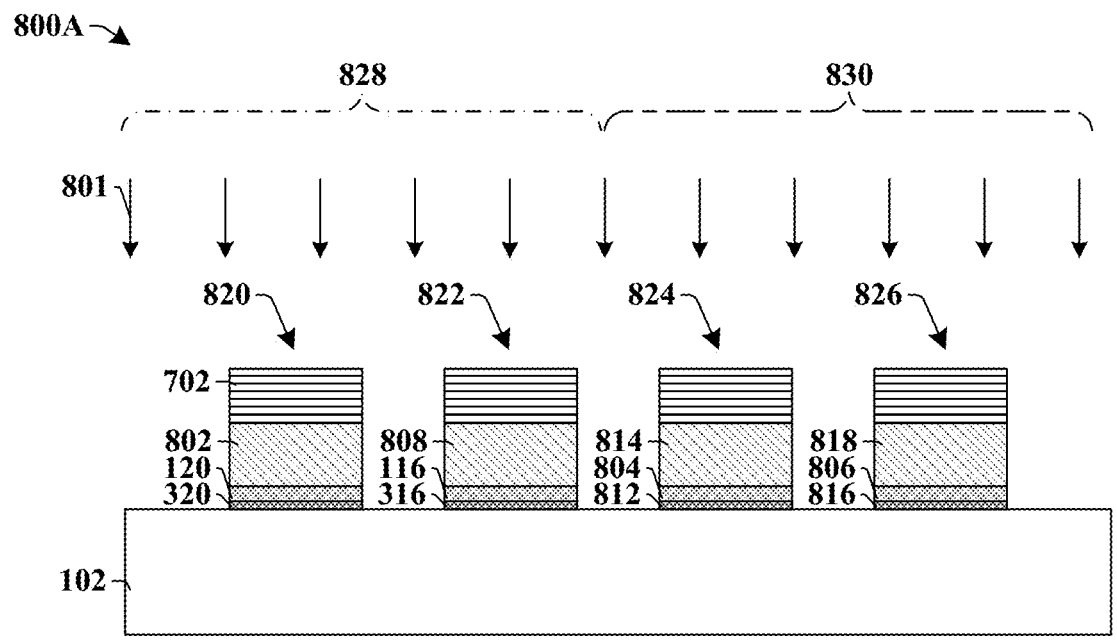

As shown in cross-sectional view 800A of FIG. 8A, a first etching process 801 is conducted to remove portions of the continuous interfacial layer (602 of FIG. 7), the continuous dielectric layer (604 of FIG. 7), and the dummy gate layer (606 of FIG. 7) that are uncovered by the first masking structure 702 to form a first dummy gate stack 820 comprising a first dummy gate electrode 802, a program dielectric layer 120, and a program interfacial layer 320; a second dummy gate stack 822 comprising a second dummy gate electrode 808, a read dielectric layer 116, and a read interfacial layer 316; a third dummy gate stack 824 comprising a third dummy gate electrode 814, an additional read dielectric layer 804, and an additional read interfacial layer 812; and a fourth dummy gate stack 826 comprising a fourth dummy gate electrode 818, an additional program dielectric layer 806, and an additional program interfacial layer 816. In some embodiments, the first etching process 801 comprises a dry etch conducted in a substantially vertical direction. In some embodiments, the first etching process 801 may comprise multiple etchants to target each material of the continuous interfacial layer (602 of FIG. 7), the continuous dielectric layer (604 of FIG. 7), and the dummy gate layer (606 of FIG. 7).

In some embodiments, a first one-time program (OTP) dummy memory cell 828 may comprise the first dummy gate stack 820 and the second dummy gate stack 822, and a second OTP dummy memory cell 830 may comprise the third dummy gate stack 824 and the fourth dummy gate stack 826.

Figure 8B:
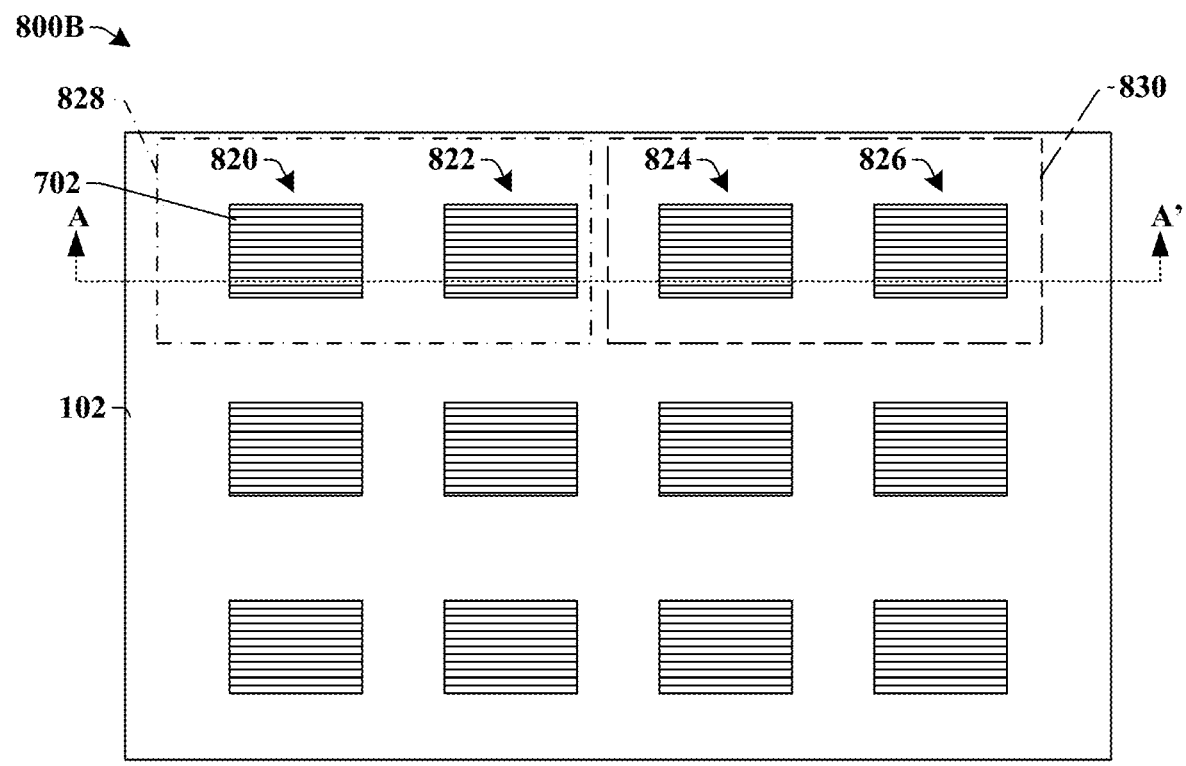

FIG. 8B illustrates a top view 800B corresponding to some embodiments of the cross-sectional view 800A of FIG. 8A.

In some embodiments, the cross-sectional view 800A of FIG. 8A may correspond to cross-section line AA' of FIG. 8B. Thus, in some embodiments, the first OTP dummy memory cell 828 and the second OTP dummy memory cell 830 may be a part of a memory cell array, as illustrated in the top view 800B of FIG. 8B.

Figure 9A:
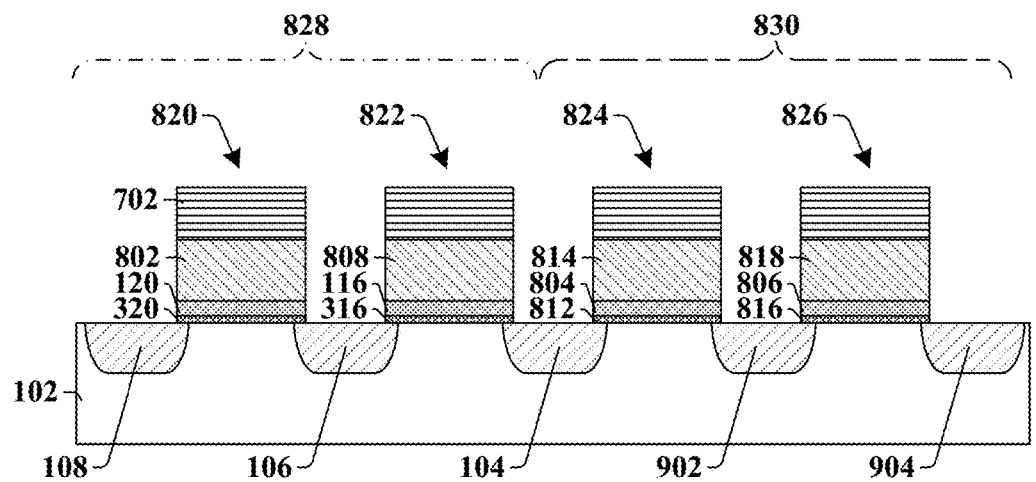

As illustrated in cross-sectional view 900A of FIG. 9A, in some embodiments, a first source/drain region 104 may be formed between the second and third dummy gate stacks 822, 824; a second source/drain region 106 may be formed between the first and second dummy gate stacks 820, 822, a third source/drain region 108 may be formed beside the first dummy gate stack 820; a fourth source/drain region 902 may be formed between the third and fourth dummy gate stacks 824, 826; and a fifth source/drain region 904 may be formed beside the fourth dummy gate stack 826. In some embodiments, the substrate 102 has a first doping type (e.g., p-type, n-type), and the first through fifth source/drain regions 104, 106, 108, 902, 904 have a second doping type (e.g., n-type, p-type) that is different than the first doping type (e.g., p-type, n-type). In some embodiments, the first through fifth source/drain regions 104, 106, 108, 902, 904 are formed via an ion implantation process. In some embodiments, the first masking structure 702 may remain on the first through fourth dummy gate stacks 820, 822, 824, 826 during the formation of the first through fifth source/drain regions 104, 106, 108, 902, 904, whereas in other embodiments (not shown), the first masking structure 702 may be removed.

Figure 9B:
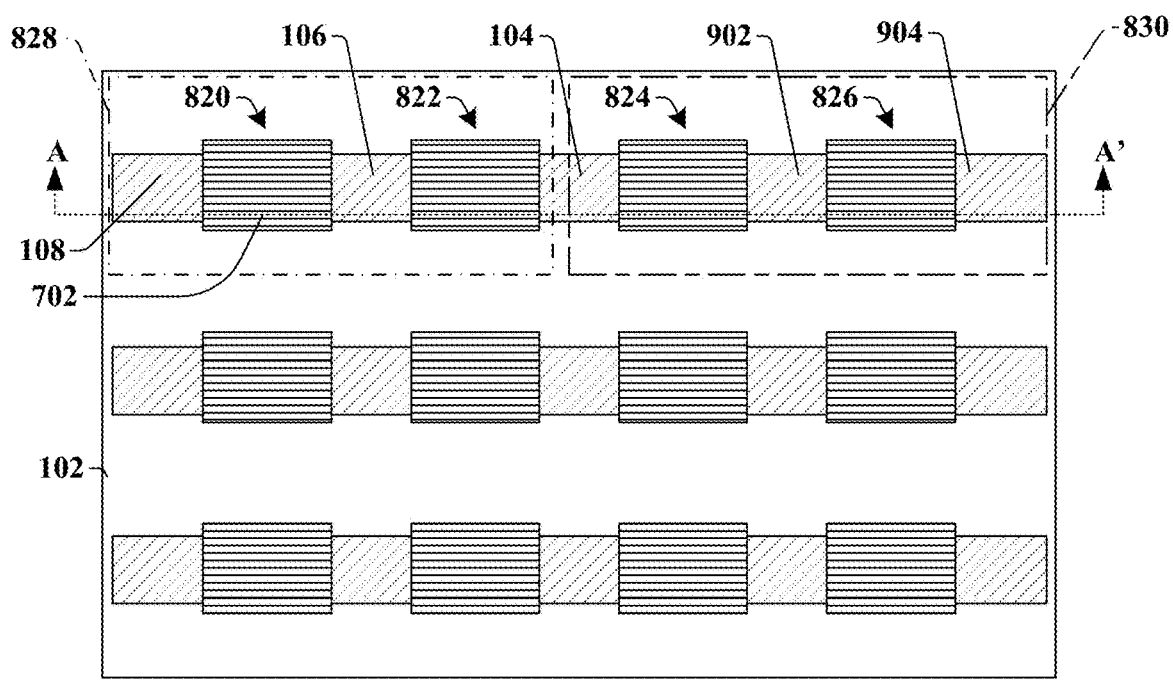

FIG. 9B illustrates a top view 900B of some embodiments corresponding to the cross-sectional view 900A of FIG. 9A.

Figure 10A:
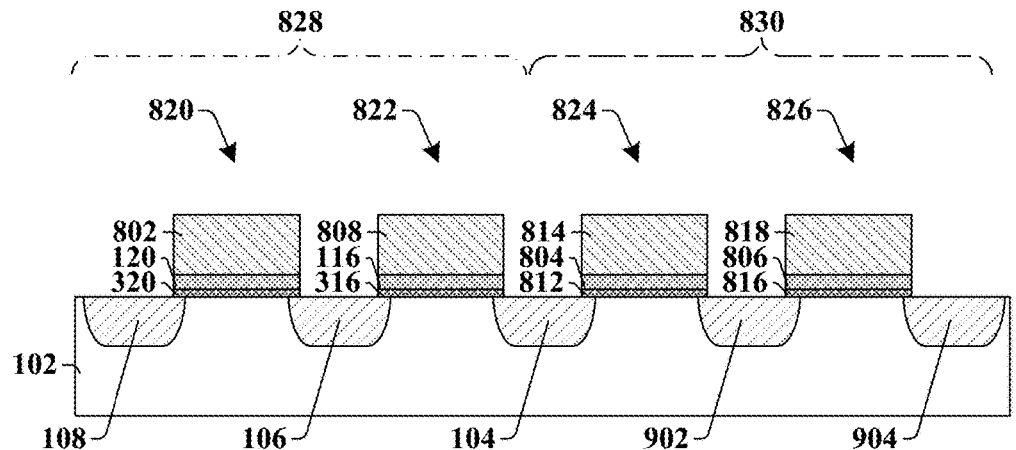

As illustrated in cross-sectional view 1000A of FIG. 10A, the first masking structure 702 is removed from the first, second, third, and fourth dummy gate stacks 820, 822, 824, 826. In some embodiments, the first masking structure 702 may be removed by a wet etchant, for example.

Figure 10B:
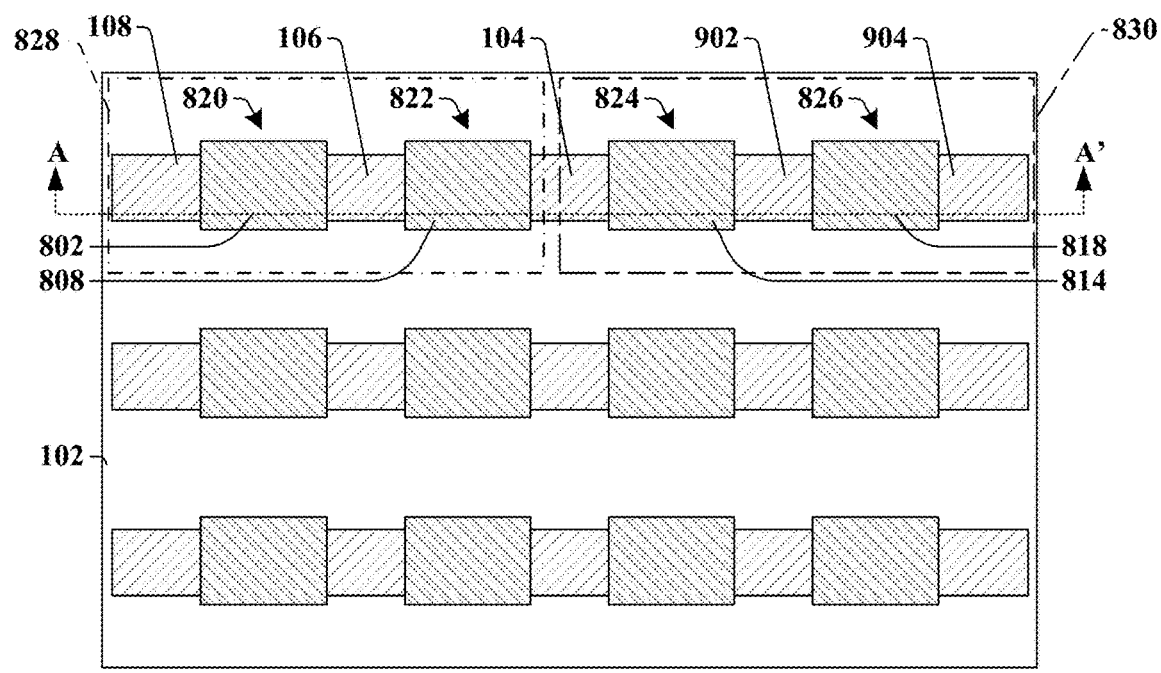

FIG. 10B illustrates a top view 1000B of some embodiments corresponding to the cross-sectional view 1000A of FIG. 10A.

Figure 11A:
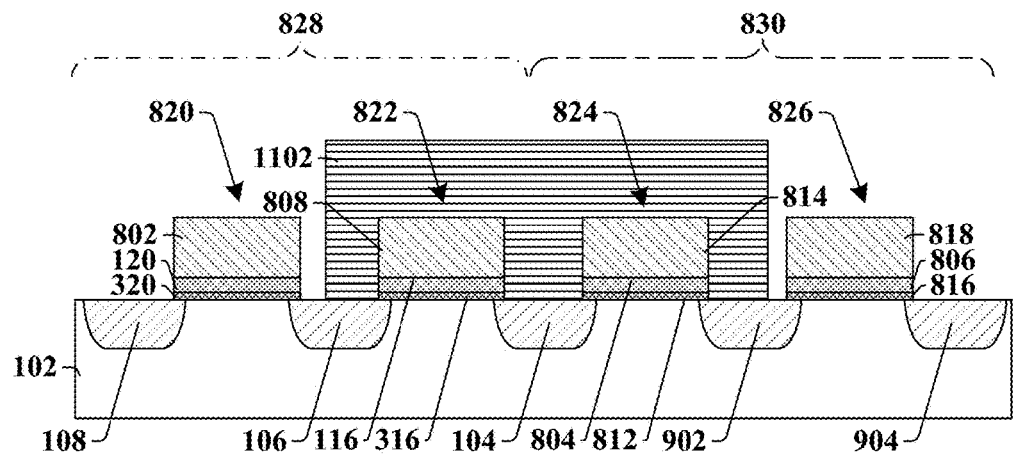

As illustrated in cross-sectional view 1100A of FIG. 11A, a second masking structure 1102 is deposited to cover the second dummy gate stack 822 and the third dummy gate stack 824 which respectively comprise the read dielectric layer 116 and the additional read dielectric layer 804. Thus, the first dummy gate stack 820 and the fourth dummy gate stack 826 comprising the program dielectric layer 120 and the additional program dielectric layer 806, respectively, are not covered by the second masking structure 1102. In some embodiments, the second masking structure 1102 may continuously extend across the second and third dummy gate stacks 822, 824 because the second dummy gate stack 822 and the third dummy gate stack 824 comprise the read dielectric layer 116 and the additional read dielectric layer 804. The second masking structure 1102 may be formed using photolithography and removal (e.g., etching) processes. In some embodiments, the second masking structure 1102 comprises a photoresist material or a hard mask material.

Further, in some embodiments, prior to the deposition of the second masking structure 1102, an inter-layer dielectric (ILD) structure may be formed between and over the first, second, third, and fourth dummy gate stacks 820, 822, 824, 826. A removal process (e.g., chemical mechanical planarization (CMP)) may be performed to remove the ILD structure from above each of the first, second, third, and fourth dummy gate stacks 820, 822, 824, 826. Thus, in some embodiments, in FIG. 11A, an ILD structure is arranged between each of the first, second, third, and fourth dummy gate stacks 820, 822, 824, 826. The ILD structure may be present throughout remaining steps of the method, in some embodiments.

Figure 11B:
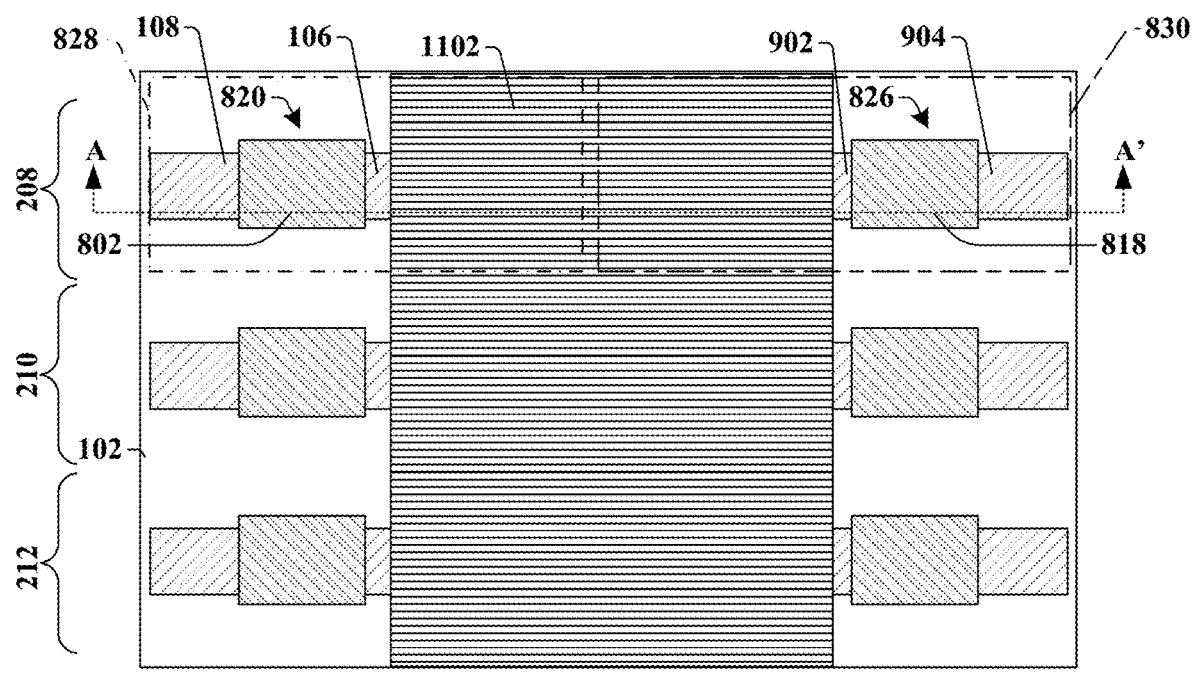

FIG. 11B illustrates a top view 1100B of some embodiments corresponding to the cross-sectional view 1100A of FIG. 11A.

In some embodiments, the second masking structure 1102 may continuously extend across a first row 208, a second row 210, and a third row 212 of the OTP memory cell array. In such embodiments, the second and third rows 210, 212 may have a same configuration as the first row 208 as illustrated in the cross-sectional view 1100A of FIG. 11A.

Figure 12A:
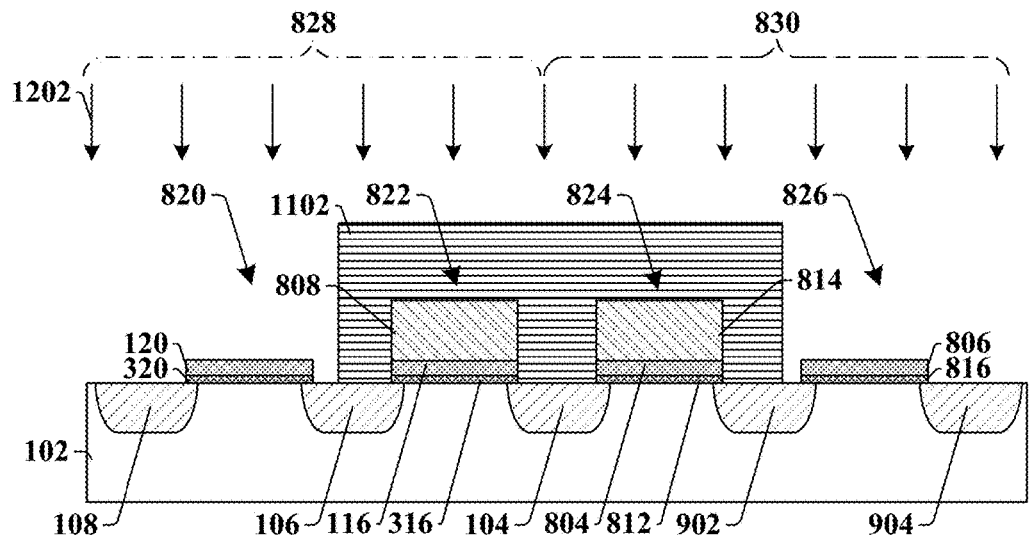

As illustrated in cross-sectional view 1200A of FIG. 12A, a second etching process 1202 is performed in some embodiments to remove the first dummy gate electrode (802 of FIG. 11A) of the first dummy gate stack 820 and to remove the fourth dummy gate electrode (818 of FIG. 11A) of the fourth dummy gate stack 826. Thus, the second etching process 1202 comprises an etchant or etchants that targets the material (e.g., polysilicon) of the first and second dummy gate electrodes (802, 818 of FIG. 11A). In some embodiments, for example, the second etching process 1202 uses a wet etchant and a dry etchant. The second etching process 1202 does not use an etchant that is suited to remove the program dielectric layer 120 or the additional program dielectric layer 806. The second etching process 1202 is conducted for a first amount of time.

In some embodiments, the second etching process 1202 uses a plasma dry etchant. The program dielectric layer 120 and the additional program dielectric layer 806 may suffer a first amount (e.g., concentration) of residual damage upon bombardment of the plasma dry etchant after the first and second dummy gate electrodes (802, 818 of FIG. 11A) have been removed during the third etching process. Thus, the second etching process 1202 may induce a first amount (e.g., concentration) of traps (e.g., defects) in the program dielectric layer 120 and the additional program dielectric layer 806. In some embodiments, the second etching process 1202 is sustained past the removal of the first and second dummy gate electrodes (802, 818 of FIG. 11A) to induce the first amount (e.g., concentration) of traps (e.g., defects) in the program dielectric layer 120 and the additional program dielectric layer 806.

Figure 14A:
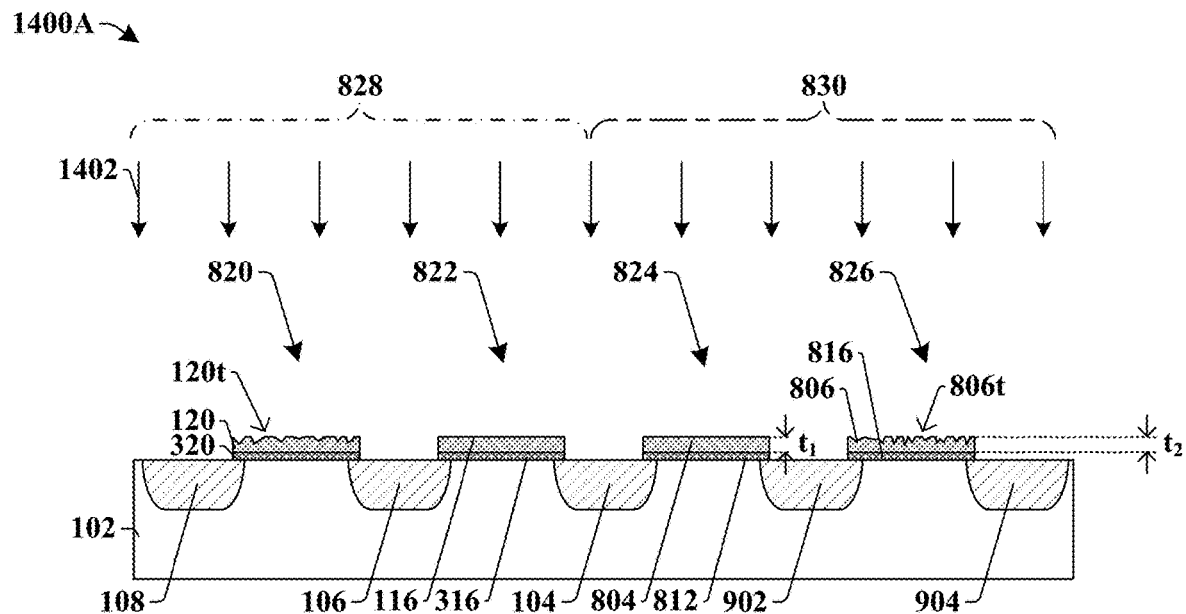

In alternative embodiments, the second etching process 1202 may not fully remove the first and second dummy gate electrodes (802, 818 of FIG. 11A), and traps may be induced into the program dielectric layer 120 and the additional program dielectric layer 806 upon exposure of the program dielectric layer 120 and the additional program dielectric layer 806 by a third etching process (e.g., 1402 of FIG. 14A).

Figure 12B:
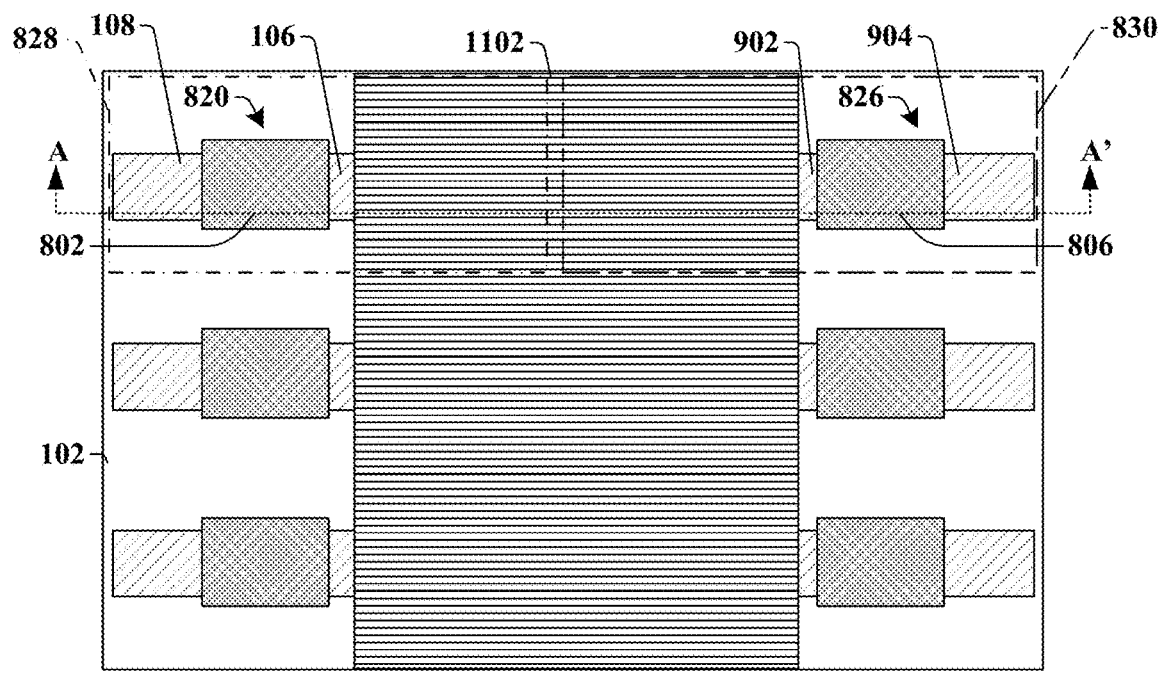

FIG. 12B illustrates a top view 1200B of some embodiments corresponding to the cross-sectional view 1200A of FIG. 12A.

Figure 13A:
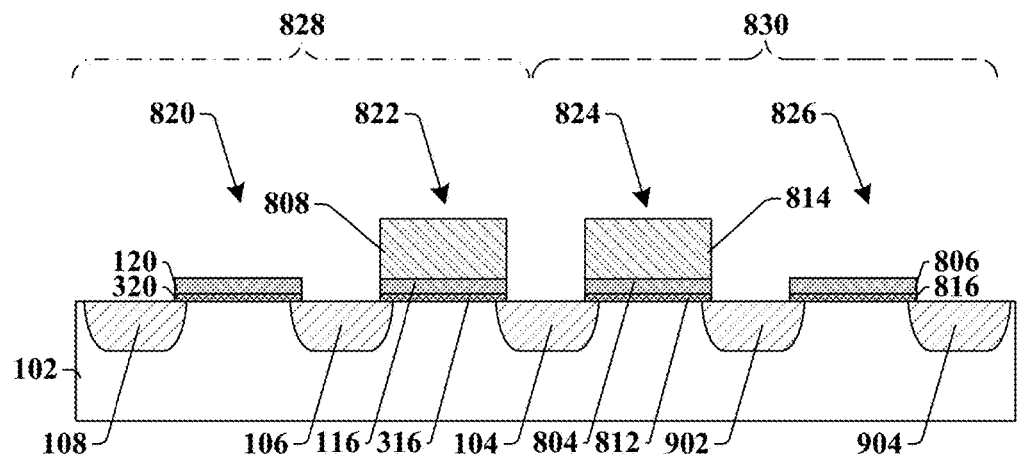

As illustrated in cross-sectional view 1300A of FIG. 13A, the second masking structure (1102 of FIG. 12A) may be removed, thereby exposing the second and third dummy gate stacks 822, 824. In some embodiments, the second masking structure (1102 of FIG. 12A) may be removed using a wet etchant.

In alternative embodiments, after the second masking structure (1102 of FIG. 12A) is removed, an additional masking structure (not shown) may be formed over the program dielectric layer 120 and the additional program dielectric layer 806.

Figure 13B:
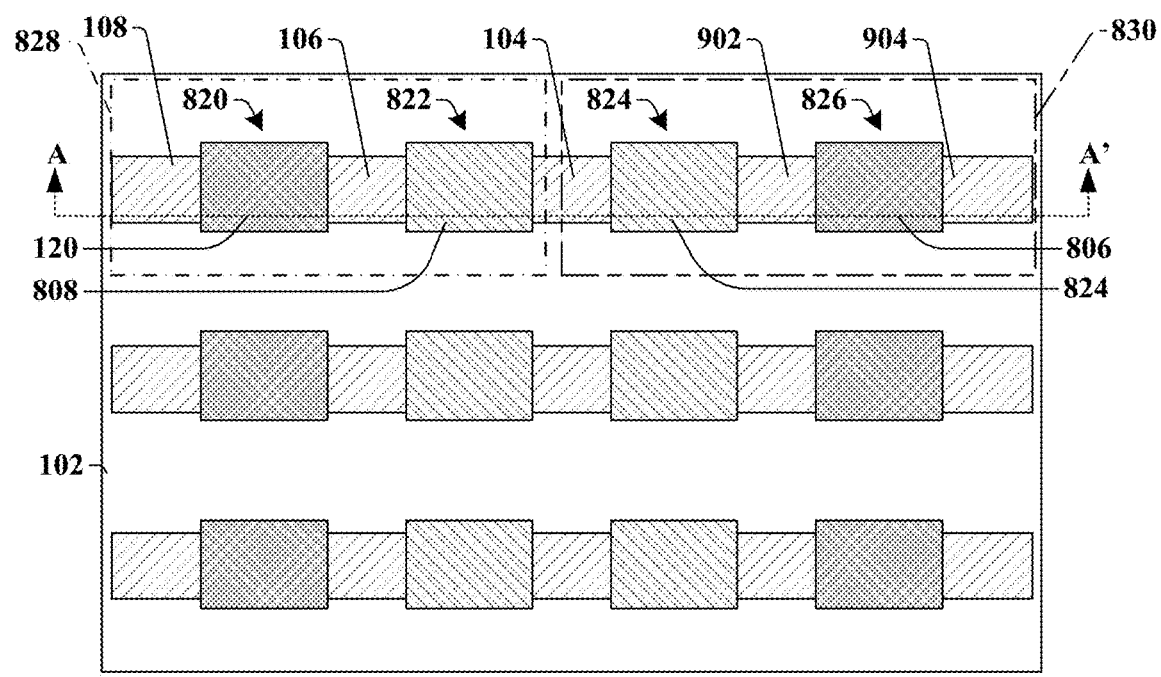

FIG. 13B illustrates a top view 1300B of some embodiments corresponding to the cross-sectional view 1300A of FIG. 13A.

As illustrated in cross-sectional view 1400A of FIG. 14A, a third etching process 1402 may be performed to remove the second and third dummy gate stacks (822, 824 of FIG. 13A), thereby exposing the read dielectric layer 116 and the additional read dielectric layer 804. In some embodiments, the third etching process 1402 uses the same etchant(s) as the second etching process 1202. The program dielectric layer 120 and the additional program dielectric layer 806 are exposed to the third etching process 1402 longer than the read dielectric layer 116 and the additional read dielectric layer 804. Thus, the third etching process 1402 may further induce traps in the program dielectric layer 120 and the additional program dielectric layer 806, such that the program dielectric layer 120 and the additional program dielectric layer 806 comprise a second amount of traps greater than the first amount of traps. In some embodiments, a third amount of traps are induced in the read dielectric layer 116 and the additional read dielectric layer 804 by the third etching process 1402; the third amount of traps is less than the second amount of traps.

The traps are defects induced in the program and additional program dielectric layers 120, 806 caused by, for example, ion bombardment by the etchants (e.g., plasma gas) used for the third etching process 1402. For example, although the third etching process 1402 may be designed to not remove the program and additional program dielectric layers 120, 806, residual damage from the ion bombardment may occur. Thus, after the third etching process 1402, the program and additional program dielectric layers 120, 806 may each have a second average surface roughness, and the read and additional read dielectric layers 116, 804 may comprise a first average surface roughness less than the second average surface roughness. Further, in some embodiments, the program and additional program dielectric layers 120, 806 may also comprise more compositional defects, such as the presence of ions, than the read and additional read dielectric layers 116, 804.

In alternative embodiments, wherein the program dielectric layer 120 and the additional program dielectric layer 806 are covered by the additional masking structure (not-shown), the third etching process 1402 may be conducted for a second amount of time that is less than the first amount of time of the second etching process (1202 of FIG. 12A). Thus, after the third etching process 1402, the program dielectric layer 120 and the additional program dielectric layer 806 are still more damaged than the read dielectric layer 116 and the additional read dielectric layer 804.

After the third etching process 1402, a top surface 120t of the program dielectric layer 120 and a top surface 806t of the additional program dielectric layer 806 may each have a second average thickness $t_2$. In some embodiments, the second average thickness $t_2$ is less than the first average thickness $t_1$ of the read and additional read dielectric layers 116, 804. In other embodiments, after the third etching process 1402, the second average thickness $t_2$ may be about equal to the first average thickness $t_1$.

Figure 14B:
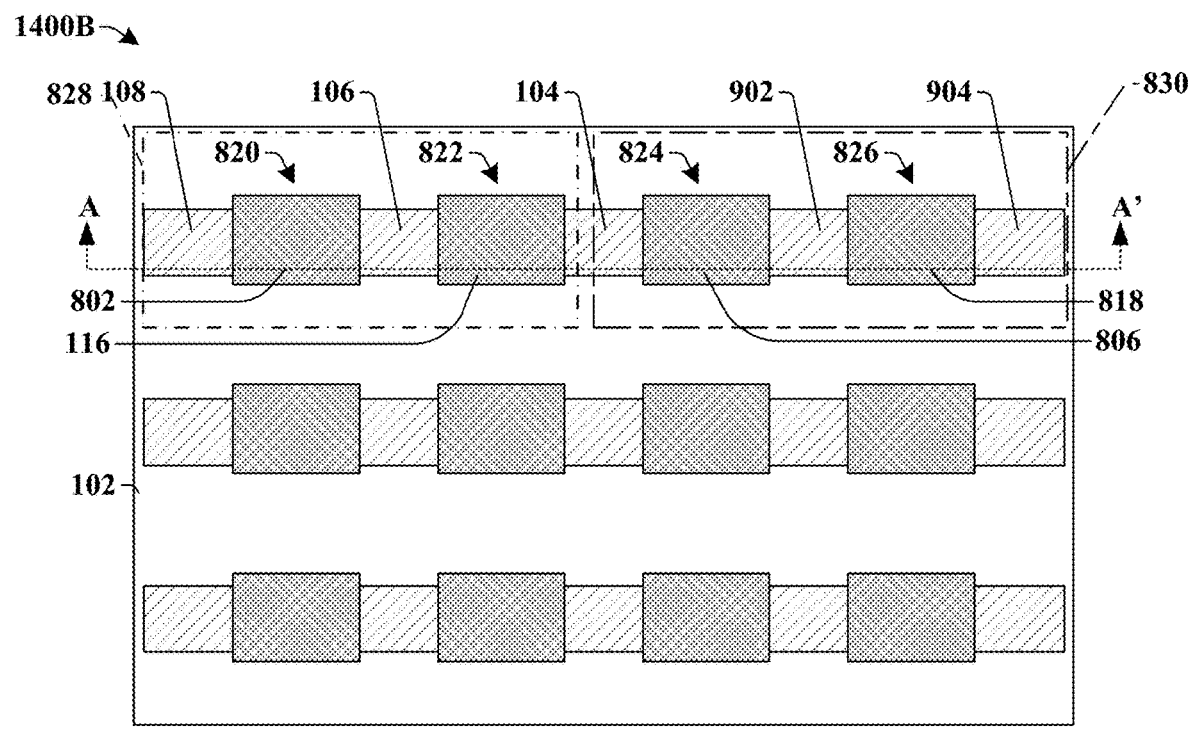

FIG. 14B illustrates a top view 1400B of some embodiments corresponding to the cross-sectional view 1400A of FIG. 14A.

Alternatively, to increase the concentration of traps in the program dielectric layer 120 and the additional program dielectric layer 806 compared to the read dielectric layer 116 and the additional read dielectric layer 804, in some embodiments, an ion bombardment or dopant implantation process may be selectively performed on the program dielectric layer 120 and the additional program dielectric layer 806. In such embodiments, the read dielectric layer 116 and the additional read dielectric layer 804 would not be exposed to the ion bombardment or dopant implantation process and thus, have a lower concentration of traps than the program dielectric layer 120 and the additional program dielectric layer 806. In such alternative embodiments, the ion bombardment and/or dopant implantation process may be performed before, after, or in place of the third etching process 1402.

For example, in some alternative embodiments, an ion bombardment or dopant implantation process may be performed between the second etching process (1202 of FIG. 12A) and the third etching process 1402 to further induce traps in the program dielectric layer 120 and the additional program dielectric layer 806. For example, in other embodiments, the formation of the second masking structure (1102 of FIG. 11A) may be omitted, and the first through fourth dummy gate electrodes (802, 808, 814, 818 of FIG. 11A) may be simultaneously removed using the second etching process (1202 of FIG. 12A). Then, in such other embodiments, an ion bombardment or dopant implantation process may be selectively performed on the program dielectric layer 120 and the additional program dielectric layer 806 and not on the read dielectric layer 116 and the additional read dielectric layer 804 to induce more traps in the program dielectric layer 120 and the additional program dielectric layer 806 than in the read dielectric layer 116 and the additional read dielectric layer 804. It will be appreciated that other processing steps and/or ordering of such processing steps that induce traps in the program dielectric layer 120 and the additional program dielectric layer 806 are also within the scope of the disclosure.

Figure 15A:
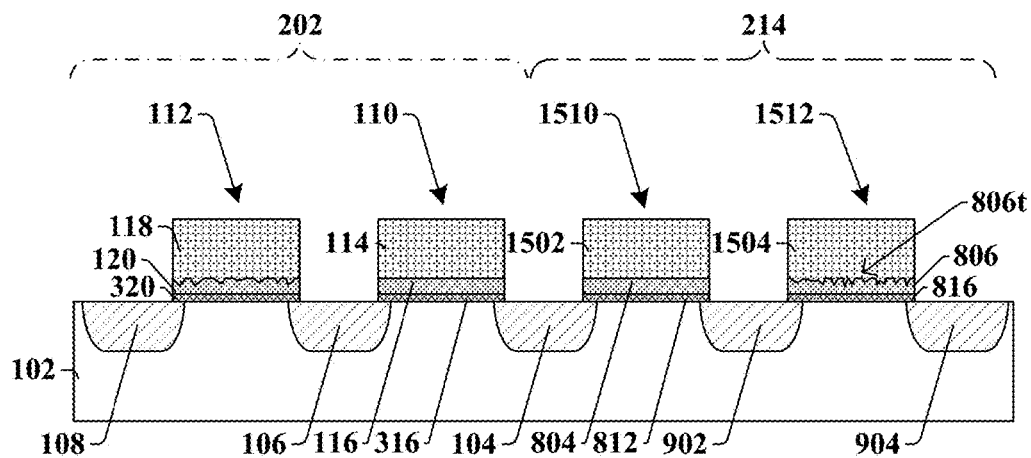

As illustrated in cross-sectional view 1500A of FIG. 15A, in some embodiments, a program gate electrode 118, a read gate electrode 114, an additional read gate electrode 1502, and an additional program gate electrode 1504 may be respectively formed over the program dielectric layer 120, the read dielectric layer 116, the additional read dielectric layer 804, and the additional program dielectric layer 806. A program gate stack 112 may comprise the program gate electrode 118, the program dielectric layer 120, and the program interfacial layer 320. A read gate stack 110 may comprise the read gate electrode 114, the read dielectric layer 116, and the read interfacial layer 316. An additional read gate stack 1510 may comprise the additional read gate electrode 1502, the additional read dielectric layer 804, and the additional read interfacial layer 812. An additional program gate stack 1512 may comprise the additional program gate electrode 1504, the additional program dielectric layer 806, and the additional program interfacial layer 816. A first OTP memory cell 202 may comprise the program gate stack 112 and the read gate stack 110, and a second OTP memory cell 214 may comprise the additional read gate stack 1510 and the additional program gate stack 1512.

In some embodiments, the program gate electrode 118, the read gate electrode 114, the additional read gate electrode 1502, and the additional program gate electrode 1504 may each comprise a first conductive material. In some embodiments, the first conductive material may be or comprise, for example, titanium, titanium nitride, aluminum, or the like. In some embodiments, the program gate electrode 118, the read gate electrode 114, the additional read gate electrode 1502, and the additional program gate electrode 1504 are formed through various steps comprising deposition processes (e.g., physical vapor deposition (PVD), chemical vapor deposition (CVD), PE-CVD, atomic layer deposition (ALD), sputtering, etc.), removal processes (e.g., wet etching, dry etching, chemical mechanical planarization (CMP), etc.), and/or patterning processes (e.g., photolithography/etching).

For example, in some embodiments, an ILD structure was formed between the first, second, third, and fourth dummy gate stacks (820, 822, 824, 826. of FIG. 11A), and the ILD structure was resistant to the second and third etching processes (e.g., 1202 of FIG. 12A and 1402 of FIG. 14A). Thus, in some embodiments, the first conductive material may be deposited over the ILD structure, and then removed from above the ILD structure using CMP. In such embodiments, the program gate electrode 118, the read gate electrode 114, the additional read gate electrode 1502, and the program gate electrode 118 may have substantially coplanar upper surfaces.

Figure 15B:
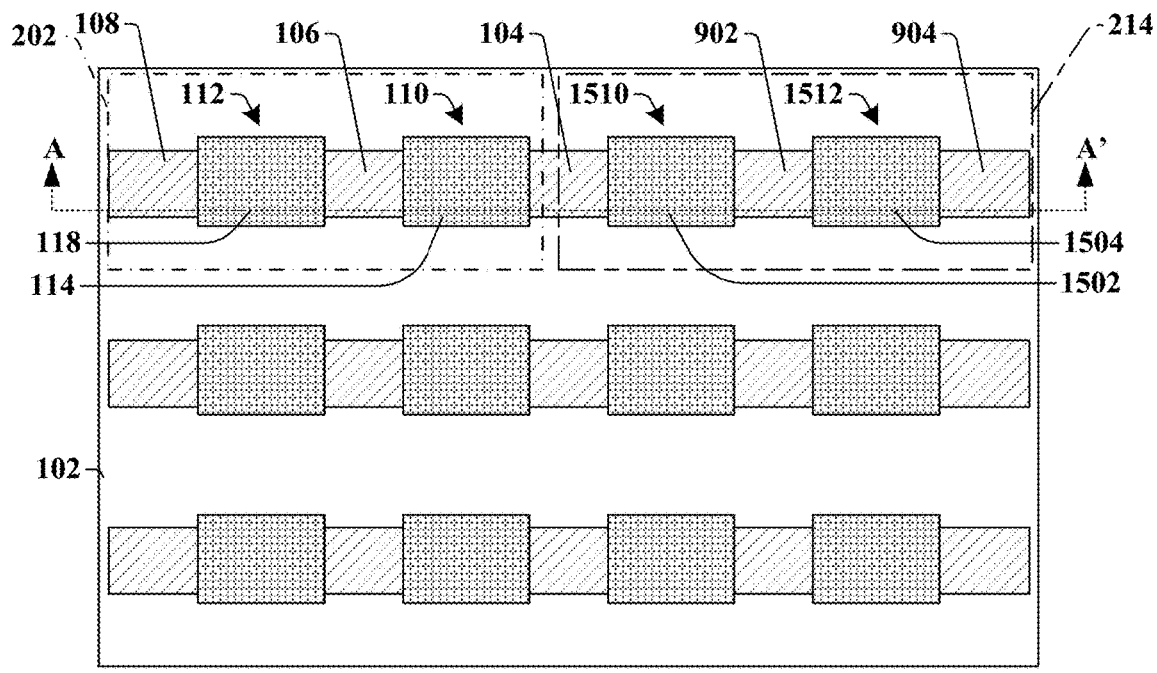

FIG. 15B illustrates a top view 1500B of some embodiments corresponding to the cross-sectional view 1500A of FIG. 15A.

Figure 17A:
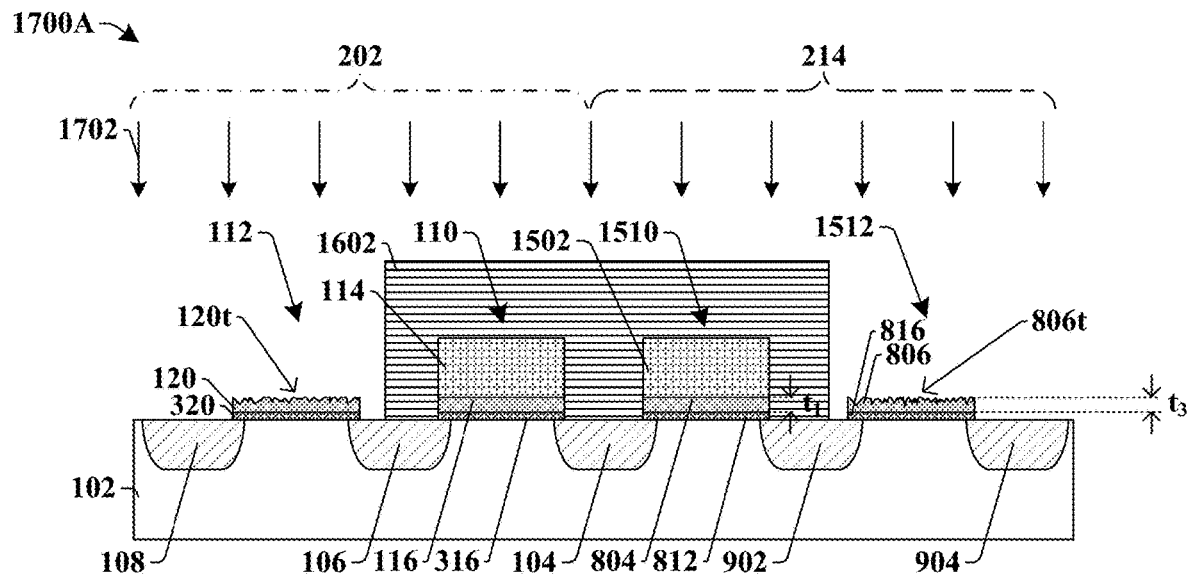
Figure 17B:
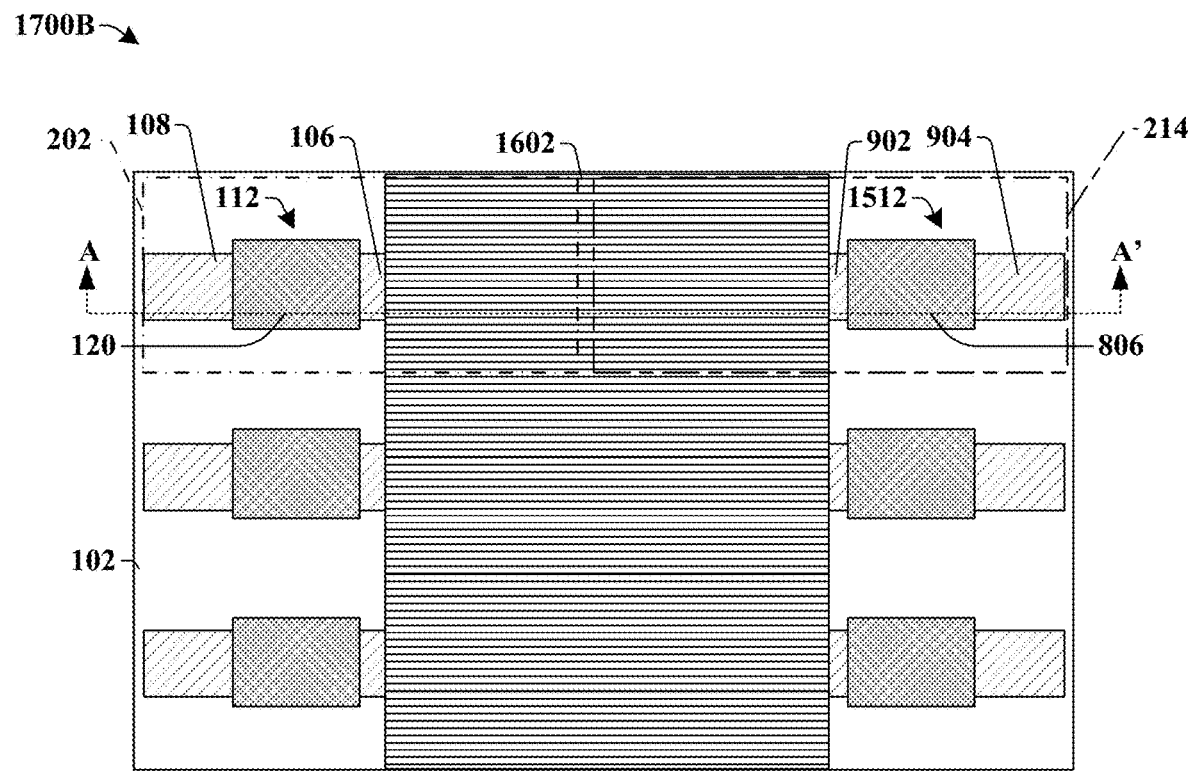
Figure 18A:
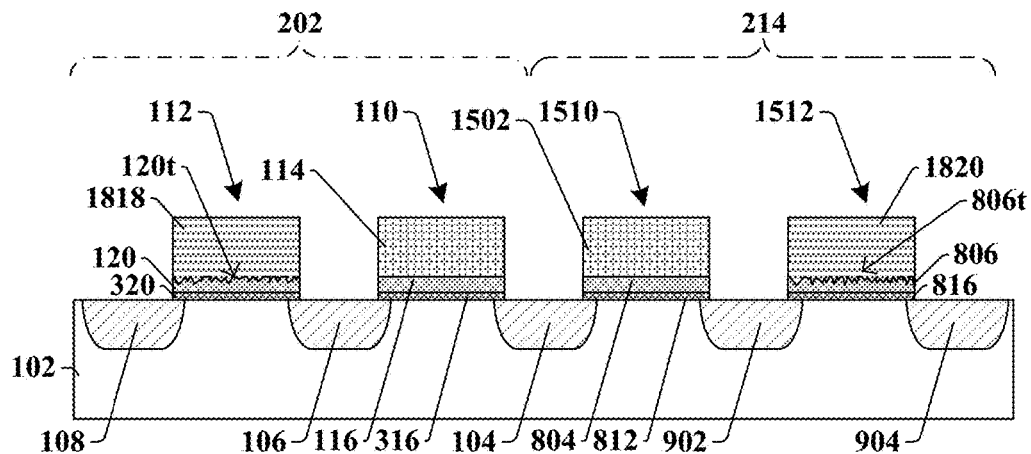
Figure 18B:
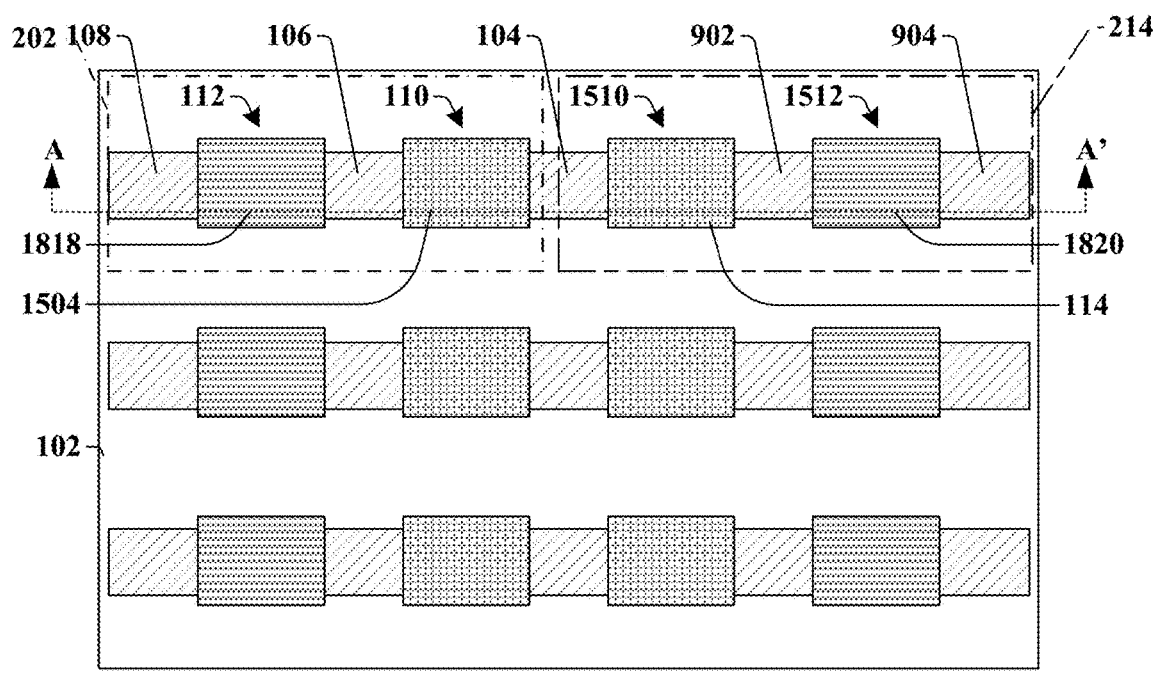
Figure 19:
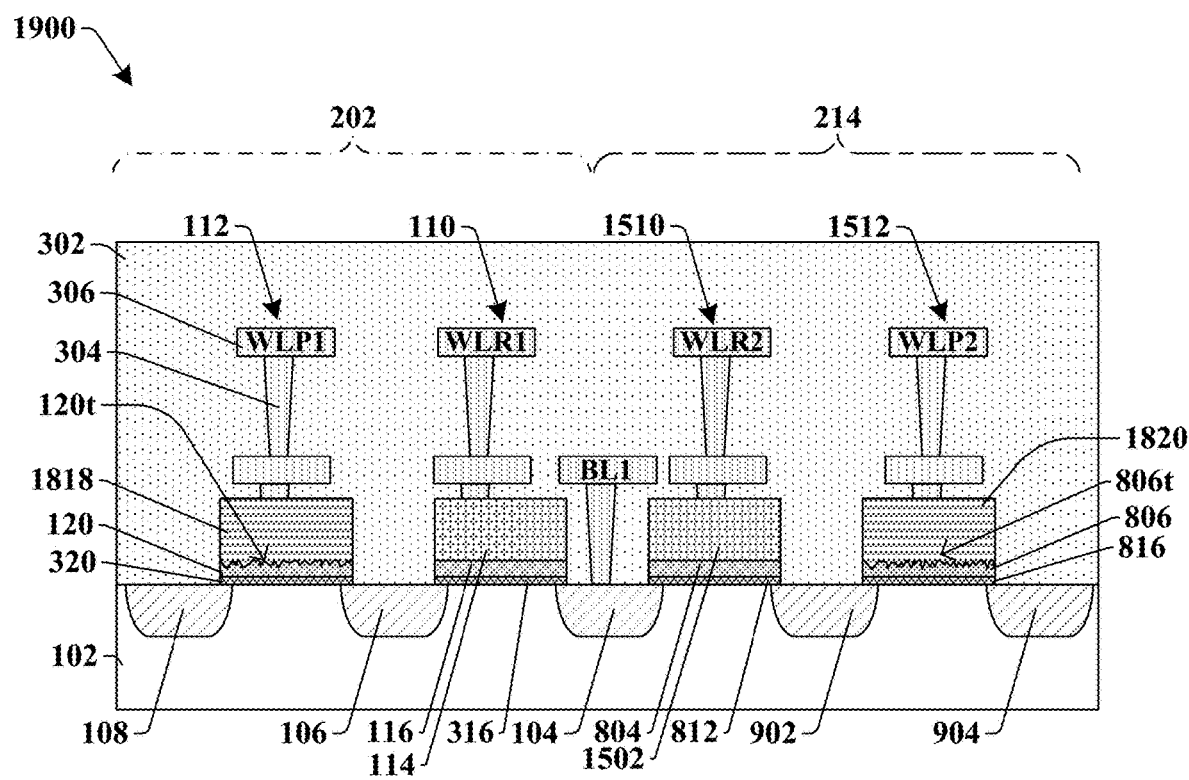

In some embodiments, after the formation of the program gate electrode 118, the read gate electrode 114, the additional read gate electrode 1502, and the additional program gate electrode 1504, the method may continue to FIG. 19, thereby skipping FIGS. 16A, 16B, 17A, 17B, 18A, and 18B. In such embodiments the program gate electrode 118, the read gate electrode 114, the additional read gate electrode 1502, and the additional program gate electrode 1504 may comprise a same conductive material. In other embodiments, the method may proceed from FIG. 15B to FIG. 16A.

Figure 16A:
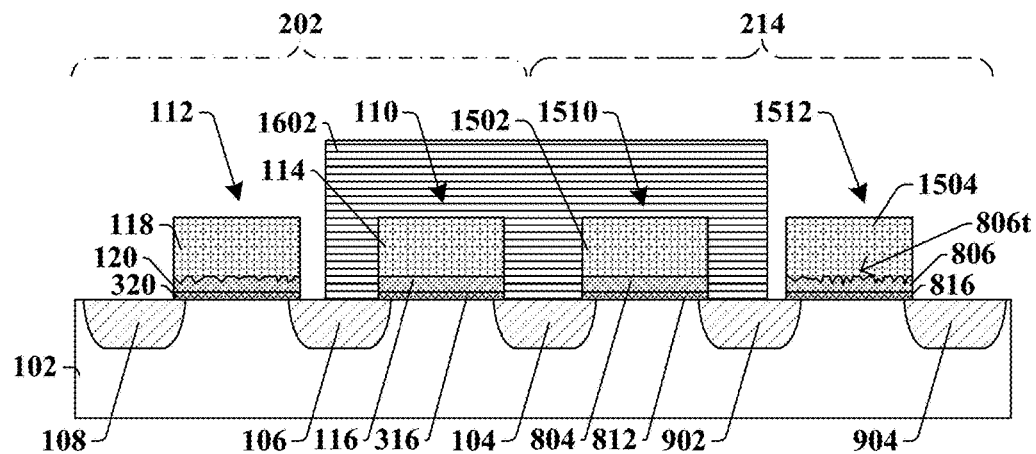

As illustrated in cross-sectional view 1600A of FIG. 16A, in some embodiments, a third masking structure 1602 is formed to cover the read gate stack 110 and the additional read gate stack 1510. Thus, the program gate stack 112 and the additional program gate stack 1512 are not covered by the third masking structure 1602. The third masking structure 1602 may be formed using photolithography and removal (e.g., etching) processes. In some embodiments, the third masking structure 1602 comprises a photoresist material or a hard mask material.

Figure 16B:
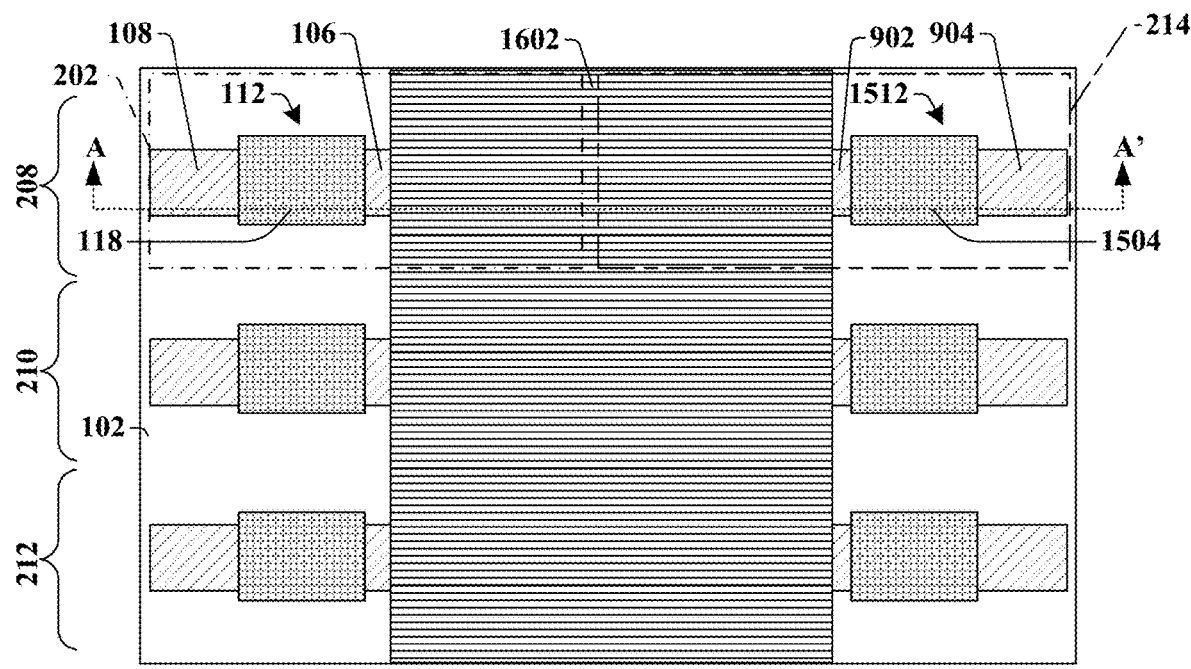

FIG. 16B illustrates a top view 1600B of some embodiments corresponding to the cross-sectional view 1600A of FIG. 16A.

In some embodiments, the third masking structure 1602 may continuously extend across the first row 208, the second row 210, and the third row 212 of the OTP memory cell array. In such embodiments, the second and third rows 210, 212 may have a same configuration as the first row 208 as illustrated in the cross-sectional view 1600A of FIG. 16A.

As illustrated in cross-sectional view 1700A of FIG. 17A, in some embodiments, a fourth etching process 1702 may be performed to remove the program gate electrode (118 of FIG. 16A) and the additional program gate electrode (1504 of FIG. 17A), thereby exposing the program dielectric layer 120 and the additional program dielectric layer 806, respectively. In some embodiments, the fourth etching process 1702 uses the same etchant(s) as the third etching process 1402. In other embodiments, the fourth etching process 1702 uses a different etchant(s) as the third etching process 1402.

The fourth etching process 1702 induces traps in the program dielectric layer 120 and the additional program dielectric layer 806, such that the program dielectric layer 120 and the additional program dielectric layer 806 comprise a fourth amount of traps greater than the second amount of traps.

Further, in some embodiments, after the fourth etching process 1702, the top surface 120*t* of the program dielectric layer 120 and the top surface 806*t* of the additional program dielectric layer 806 may each have a third average surface roughness that is greater than the second average surface roughness. The increase in average surface roughness may quantify the increase in traps in the program dielectric layer 120 and the additional program dielectric layer 806. Further, in some embodiments, after the fifth etching process, the program dielectric layer 120 and the additional program dielectric layer 806 may each have a third average thickness $t_3$. In some embodiments, the fourth etching process 1702 may cause enough damage that the third average thickness $t_3$ is less than the second average thickness $t_2$ and thus, also less than the first average thickness $t_1$. In other embodiments, the third average thickness $t_3$ may be about equal to the first and/or second average thicknesses $t_1$, $t_2$.

Thus, due to residual effects of the fourth etching process 1702, the program dielectric layer 120 and the additional program dielectric layer 806 may have an increased number of traps, and thus, a lower breakdown voltage than the read dielectric layer 116 and the additional read dielectric layer 804. Parameters (e.g., etchant, etching time, temperature, etc.) of the fourth etching process 1702 may be controlled to control the amount of traps to induce in the program dielectric layer 120 and the additional program dielectric layer 806 to control the breakdown voltage of the program dielectric layer 120 and the additional program dielectric layer 806.

FIG. 17B illustrates a top view 1700B of some embodiments corresponding to the cross-sectional view 1700A of FIG. 17A.

Alternatively, in some embodiments to further increase the concentration of traps and lower the breakdown voltage in the program dielectric layer 120 and the additional program dielectric layer 806, an ion bombardment or dopant implantation process may be performed in addition to the fourth etching process (1702 of FIG. 17A). In such alternative embodiments, the ion bombardment or dopant implantation process may be selectively performed on the program dielectric layer 120 and the additional program dielectric layer 806 and not on the read dielectric layer 116 or the additional read dielectric layer 804. It will be appreciated that other processing steps that induce traps in the program dielectric layer 120 and the additional program dielectric layer 806 are also within the scope of the disclosure.

As illustrated in cross-sectional view 1800A of FIG. 18A, in some embodiments, the third masking structure 1602 may be removed and a second program gate electrode 1818 and a second additional program gate electrode 1820 may be respectively formed over the program dielectric layer 120 and the additional program dielectric layer 806. In some embodiments, the second program gate electrode 1818 and the second additional program gate electrode 1820 may comprise a different material than the read gate electrode 114 and the additional read gate electrode 1502. In some embodiments, the second program gate electrode 1818 and the second additional program gate electrode 1820 may, for example, be or comprise titanium, titanium nitride, aluminum, or the like. In some embodiments, the second program gate electrode 1818 and the second additional program gate electrode 1820 are formed through various steps comprising deposition processes (e.g., physical vapor deposition (PVD), chemical vapor deposition (CVD), PE-CVD, atomic layer deposition (ALD), sputtering, etc.), removal processes (e.g., wet etching, dry etching, chemical mechanical planarization (CMP), etc.), and/or patterning processes (e.g., photolithography/etching).

FIG. 18B illustrates a top view 1800B of some embodiments corresponding to the cross-sectional view 1800A of FIG. 18A.

As illustrated in cross-sectional view 1900 of FIG. 19, an interconnect structure comprising interconnect vias 304 and interconnect wires 306 embedded in an interconnect dielectric structure 302 may be formed over the substrate 102. In some embodiments, the interconnect dielectric structure 302 may comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. The interconnect vias 304 and the interconnect wires 306 may comprise, in some embodiments, conductive materials, such as, for example, tungsten, copper, aluminum, or the like. The interconnect dielectric structure 302, the interconnect vias 304, and the interconnect wires 306 are formed through various steps comprising deposition processes (e.g., physical vapor deposition (PVD), chemical vapor deposition (CVD), PE-CVD, atomic layer deposition (ALD), sputtering, etc.), removal processes (e.g., wet etching, dry etching, chemical mechanical planarization (CMP), etc.), and/or patterning processes (e.g., photolithography/etching).

In some embodiments, a first program word-line WLP1 is coupled to the program gate stack 112, a second program word-line WLP is coupled to the additional program gate stack 1512, a first read word-line WLR1 is coupled to the read gate stack 110, and a second read word-line WLR2 is coupled to the additional read gate stack 1510. The first source/drain region 104 may be coupled to a first bit-line BL1. Thus, the first OTP memory cell 202 may be turned "ON" for a read or write operation by applying voltages to the first program word-line WLP1, the first read word-line WLR1, and the first bit-line BL1. The second OTP memory cell 214 be turned "ON" for a read or write operation by applying voltages to the second program word-line WLP2, the second read word-line WLR2, and the first bit-line BL1. Because the program dielectric layer 120 and the additional program dielectric layer 806 were exposed to more or longer etching processes (e.g., second etching process 1202 of FIG. 12A, third etching process 1402 of FIG. 14A, and/or fourth etching process 1702 of FIG. 17A) than the read dielectric layer 116 and the additional read dielectric layer 804, the breakdown voltages of the program dielectric layer 120 and the additional program dielectric layer 806 are lower than the breakdown voltages of the read dielectric layer 116 and the additional read dielectric layer 804. Thus, it takes less power to write on the first and second OTP memory cells 202, 214 during a write operation, and a stronger read current may be read from the first bit-line BL1 during a read operation, thereby increasing the reliability and efficiency of the first and second OTP memory cells 202, 214.

Figure 20:
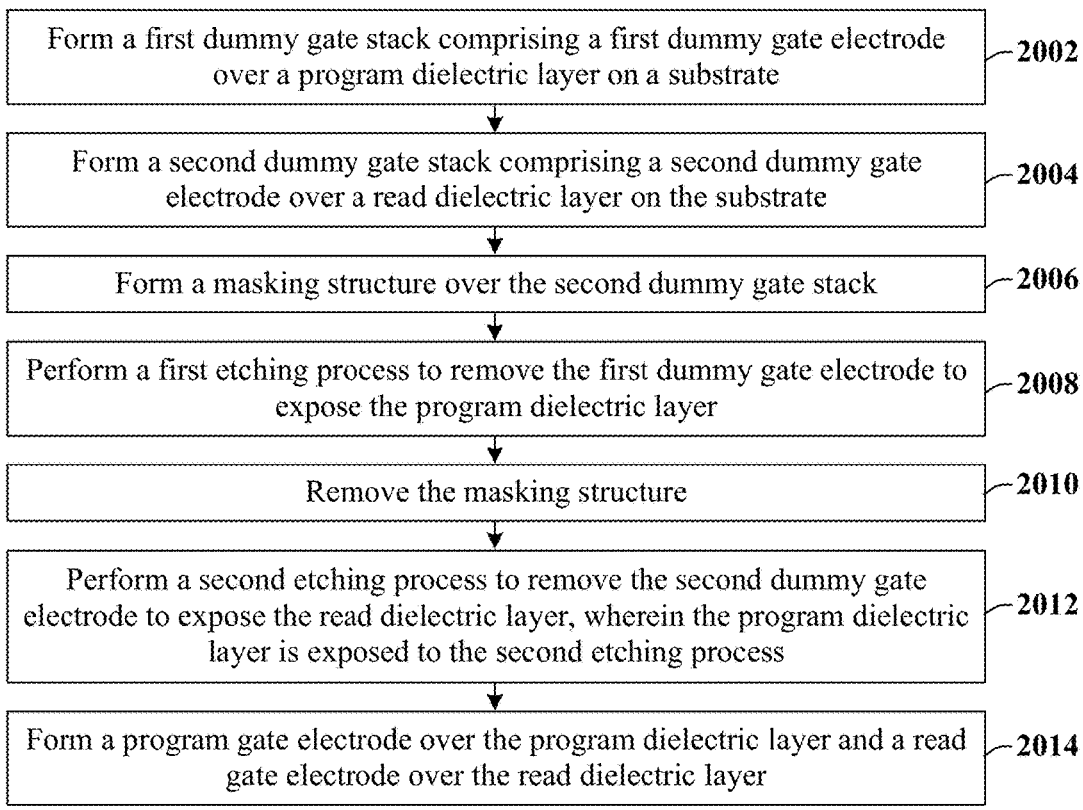
FIG. 20 illustrates a flow diagram of some embodiments of a method corresponding to FIGS. 6, 7, 8A and 8B through 18A and 18B, and 19.

FIG. 20 illustrates a flow diagram of some embodiments of a method 2000 of controlling the number of traps to reduce the breakdown voltage of a program dielectric layer in an OTP memory cell.

While method 2000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2002, a first dummy gate stack comprising a first dummy gate electrode over a program dielectric layer is formed on a substrate.

At act 2004, a second dummy gate stack comprising a second dummy gate electrode over a read dielectric layer is formed on the substrate. FIG. 8A illustrates a cross-sectional view 800A of some embodiments corresponding to acts 2002 and 2004.

At act 2006, a masking structure is formed over the second dummy gate stack. FIG. 11A illustrates a cross-sectional view 1100A of some embodiments corresponding to act 2006.

At act 2008, a first etching process is performed to remove the first dummy gate electrode to expose the program dielectric layer. FIG. 12A illustrates a cross-sectional view 1200A of some embodiments corresponding to act 2008.

At act 2010, the masking structure is removed. FIG. 13A illustrates a cross-sectional view 1300A of some embodiments corresponding to act 2010.

At act 2012, a second etching process is performed to remove the second dummy gate electrode to expose the read dielectric layer, wherein the program dielectric layer is exposed to the second etching process. FIG. 14A illustrates a cross-sectional view 1400A of some embodiments corresponding to act 2012.

At act 2014, a program gate electrode is formed over the program dielectric layer, and a read gate electrode is formed over the read dielectric layer. FIG. 15A illustrates a cross-sectional view 1500A of some embodiments corresponding to act 2014.

Therefore, the present disclosure relates to a method of manufacturing a first OTP memory cell that has a program dielectric layer with more traps to induce a lower breakdown voltage to improve the reliability and efficiency of the first OTP memory cell.

Accordingly, in some embodiments, the present disclosure relates to a one-time program (OTP) memory cell, comprising: a read transistor comprising a read dielectric layer and a read gate electrode overlying the read dielectric layer; and a program transistor neighboring the read transistor, wherein the program transistor comprises a program dielectric layer and a program gate electrode overlying the program dielectric layer, wherein the program transistor has a smaller breakdown voltage than the read transistor.

In other embodiments, the present disclosure relates to a one-time program (OTP) memory cell, comprising: a read transistor coupled in series with a program transistor over a substrate; wherein the read transistor comprises a read dielectric layer arranged between a read gate electrode and the substrate; wherein the program transistor comprises a program dielectric layer arranged between a program gate electrode and the substrate; wherein the read dielectric layer has a first average surface roughness; and wherein the program dielectric layer has a second average surface roughness that is greater than the first average surface roughness.

In yet other embodiments, the present disclosure relates to a method of forming a one-time program (OTP) memory cell, the method comprising: forming a first dummy gate stack comprising a first dummy gate electrode over a program dielectric layer on a substrate; forming a second dummy gate stack comprising a second dummy gate electrode over a read dielectric layer on the substrate; forming a masking structure over the second dummy gate stack; performing a first etching process to remove the first dummy gate electrode to expose the program dielectric layer; removing the masking structure; performing a second etching process to remove the second dummy gate electrode to expose the read dielectric layer, wherein the program dielectric layer is exposed to the second etching process; and forming a program gate electrode over the program dielectric layer and a read gate electrode over the read dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a one-time program (OTP) memory cell, the method comprising:
    forming a first dummy gate stack comprising a first dummy gate electrode over a program dielectric layer on a substrate;
    forming a second dummy gate stack comprising a second dummy gate electrode over a read dielectric layer on the substrate;
    forming a masking structure over the second dummy gate stack;
    performing a first etching process to remove the first dummy gate electrode to expose the program dielectric layer;
    removing the masking structure;
    performing a second etching process to remove the second dummy gate electrode to expose the read dielectric layer, wherein the program dielectric layer is exposed to the second etching process; and
    forming a program gate electrode over the program dielectric layer and a read gate electrode over the read dielectric layer.

2. The method of claim 1, wherein in the first etching process and the second etching process use a same plasma etchant.

3. The method of claim 2, wherein the program dielectric layer is exposed to the same plasma etchant for a longer time period than the read dielectric layer.

4. The method of claim 1, wherein before the first etching process, the program dielectric layer has a first average surface roughness, and wherein after the second etching process, the program dielectric layer has a second average surface roughness greater than the first average surface roughness.

5. The method of claim 4, wherein the method further comprises:
    forming an additional masking structure over the read gate electrode;
    performing a third etching process to remove the program gate electrode to expose the program dielectric layer;

forming a second program gate electrode over the program dielectric layer, wherein the second program gate electrode comprises a different material than the read gate electrode; and removing the additional masking structure.

6. The method of claim 5, wherein after the second program gate electrode is formed on the program dielectric layer, the program dielectric layer has a third average surface roughness greater than the second average surface roughness.

7. A method of forming a one-time program (OTP) memory cell, the method comprising:
forming a first dummy gate stack comprising a first dummy gate over a program dielectric layer on a substrate;
forming a second dummy gate stack comprising a second dummy gate over a read dielectric layer on the substrate;
replacing the first and second dummy gates respectively with a first program gate electrode and a read gate electrode;
performing a first etch into the first program gate electrode, while the read gate electrode is masked, to remove the first program gate electrode and to increase a concentration of traps in the program dielectric layer; and
forming a second program gate electrode overlying the program dielectric layer, wherein the second program gate electrode is a different conductive material than the read gate electrode.

8. The method according to claim 7, wherein a top of the program dielectric layer and a top of the read dielectric layer respectively have a first average surface roughness and a second average surface roughness, and wherein a difference between the first average surface roughness and the second average surface roughness increases from a beginning of the first etch to an end of the first etch.

9. The method according to claim 7, wherein the replacing comprises:
a second etch into the program dielectric layer while the read dielectric layer is masked by the second dummy gate.

10. The method according to claim 9, wherein the replacing further comprises removing the first dummy gate before the second etch.

11. The method according to claim 9, wherein the second etch increases the concentration of traps in the program dielectric layer relative to a concentration of traps in the read dielectric layer.

12. The method according to claim 7, wherein the read and program dielectric layers have a common top surface roughness at a beginning of the replacing, and wherein the program dielectric layer has a greater top surface roughness than the read dielectric layer at an end of the replacing.

13. The method according to claim 7, wherein the forming of the first and second dummy gate stacks comprises:
depositing a dielectric layer overlying the substrate;
depositing a dummy layer overlying the dielectric layer; and
patterning the dummy and dielectric layers respectively into the first dummy gate stack and the second dummy gate stack.

14. A method of forming a one-time program (OTP) memory cell, the method comprising:
forming a first dummy gate stack comprising a first dummy gate over a program dielectric layer on a substrate;
forming a second dummy gate stack comprising a second dummy gate over a read dielectric layer on the substrate; and
replacing the first and second dummy gates respectively with a program gate electrode and a read gate electrode, wherein the replacing comprises:
performing a first etch into the first dummy gate while the second dummy gate is masked to remove the first dummy gate; and
performing a second etch into the program dielectric layer and the second dummy gate, wherein the second etch thins the program dielectric layer and removes the second dummy gate;
wherein the program and read dielectric layers share a common breakdown voltage at a beginning of the replacing, and wherein the program dielectric layer has a lesser breakdown voltage than the read dielectric layer at an end of the replacing.

15. The method according to claim 14, further comprising:
doping the substrate to from a source/drain region in the substrate, between and bordering the first and second dummy gate stacks.

16. The method according to claim 14, wherein the first and second etches comprise ion bombardment.

17. The method according to claim 14, wherein the read and program dielectric layers share a common thickness at the beginning of the replacing, and wherein the program dielectric layer has a lesser thickness than the read dielectric layer at the end of the replacing.

18. The method according to claim 14, wherein the read and program dielectric layers are formed from a common deposition.

19. The method according to claim 14, wherein in the first etch and the second etch use a same plasma etchant.

20. The method of claim 19, wherein the program dielectric layer is exposed to the same plasma etchant for a longer time period than the read dielectric layer.

* * * * *